United States Patent
Hatanaka et al.

(10) Patent No.: US 6,229,249 B1
(45) Date of Patent: *May 8, 2001

(54) SURFACE-MOUNT TYPE CRYSTAL OSCILLATOR

(75) Inventors: Hidefumi Hatanaka, Kokubu; Ryouma Sasagawa, Hayato-cho; Hideomi Yonemura, Kokubu; Naoki Hayashi, Hayato-cho, all of (JP)

(73) Assignee: Kyocera Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/387,216

(22) Filed: Aug. 31, 1999

(30) Foreign Application Priority Data

| Aug. 31, 1998 | (JP) | 10-244278 |
| Aug. 31, 1998 | (JP) | 10-244279 |
| Oct. 30, 1998 | (JP) | 10-309661 |
| Oct. 30, 1998 | (JP) | 10-309662 |
| Oct. 30, 1998 | (JP) | 10-309663 |
| Oct. 30, 1998 | (JP) | 10-309664 |

(51) Int. Cl.[7] .................................................. H01L 41/053
(52) U.S. Cl. ............................................................ 310/348
(58) Field of Search .................................... 310/348, 349, 310/313 R

(56) References Cited

U.S. PATENT DOCUMENTS

| 4,232,512 | * | 11/1980 | Yoshikawa et al. | 368/82 |
| 4,342,105 | * | 7/1982 | Dorfman | 368/88 |
| 5,438,219 | | 8/1995 | Kotzan et al. | 257/469 |
| 5,500,628 | | 3/1996 | Knecht | 331/68 |
| 5,949,294 | * | 9/1999 | Kondo et al. | 331/68 |
| 5,982,077 | * | 1/2000 | Ide et al. | 310/366 |
| 6,016,024 | * | 1/2000 | Unami et al. | 310/345 |

* cited by examiner

*Primary Examiner*—Thomas M. Dougherty
(74) *Attorney, Agent, or Firm*—Hogan & Hartson, LLP

(57) ABSTRACT

In a surface-mount type crystal oscillator according to the invention, a part of side surfaces of a lower cavity are formed into bulging space portions bulging into separating areas between adjacent ones of a plurality of terminal electrodes provided around the lower cavity. By accommodating an IC chip and an electronic device in the lower cavity including the bulging space portions, the crystal oscillator can be miniaturized without affecting the size of the plurality of terminal electrodes.

18 Claims, 22 Drawing Sheets

SURFACE-MOUNT TYPE CRYSTAL OSCILLATOR

This application is based on Japanese patent application Nos. 10-217291, 10-244278, 10-244279, 10-309661, 10-309662, 10-309663 and 10-309664 filed in Japan, the contents of which are hereby incorporated by reference.

BACKGROUND OF THE INVENTION

This invention relates to a surface-mount type crystal oscillator, for example, a crystal oscillator for use in a mobile communications apparatus.

A crystal oscillator of this type is an essential part for generating an oscillation signal for control of signal reception and transmission between mobile communications apparatus or the like. Such a crystal oscillator is required to have a very small volume as the mobile communications apparatus is constructed smaller and to have an oscillation signal having a stable frequency even if being used under environment where ambient temperature drastically changes.

In response to such request, temperature compensation is performed to make an oscillating frequency independent of ambient temperature against an intrinsic temperature-frequency variation characteristic of the crystal oscillator (for example, an AT-cut sliding crystal oscillator has a temperature-frequency variation characteristic represented by a three-dimensional curve). In order to conduct this temperature compensation in a small crystal oscillator with high accuracy, the variation in oscillating frequency of the crystal oscillator which varies with ambient temperature is flattened as a whole by setting a capacity value of a varicap diode at a suitable predetermined value based on temperature compensation data, using an oscillating inverter and an IC chip having integration of memory function for storing temperature compensation data corresponding to specified temperatures, voltage converting function, varicap diode function and control function.

Another crystal oscillator is known in which a crystal oscillating element is mounted in a main body as it is and an accommodation space therefor is hermetically sealed. A typical construction is as follows. A main body is formed with a cavity having a stepped portion. A control device is placed on a bottom surface of the cavity. A crystal oscillating element is placed on the stepped portion and the entire cavity is hermetically sealed by a metal cover. Such a construction does not use a can case and, therefore, can be made smaller because the crystal oscillating element and the control device are placed one on top of the other in the cavity along thickness direction. However, since the control device and the crystal oscillating element are arranged in the same cavity, the crystal oscillating element operates in an unstable manner if members for coupling or protecting the control device produce unnecessary gases.

Japanese Unexamined Patent Publication No. 10-28024 discloses a small crystal oscillator provided with external terminal electrodes on a surface thereof which satisfies the aforementioned demands and is able to highly accurately conduct a temperature compensation. This crystal oscillator includes a plate-like substrate and a rectangular hollow member attached on a bottom surface of the plate-like substrate. The rectangular hollow member has a rectangular space. The plate-like substrate and the rectangular hollow member defines a cavity. A crystal oscillating element is mounted on a top surface of the plate-like substrate while a control circuit is provided on a bottom surface of the plate-like substrate and in the cavity.

FIGS. 27 to 29 show a conventional temperature compensating crystal oscillator. This crystal oscillator is mainly comprised of a main body 1051, a rectangular crystal oscillating element 1052, an IC chip 1053 or controlling element constituting an oscillation control circuit and a metal cover 1054. This crystal oscillator includes a main body 1051 which is an integral assembly of a single-plate ceramic substrate 1055 and a rectangular hollow member 1056 provided on the bottom surface of the substrate 1055. The rectangular hollow member 1056 has a rectangular space. Thus, a cavity 1057 is defined in a lower portion of the main body 1051.

The ceramic substrate 1055 partitioning the top surface of the main body 1051 and the ceiling surface of the cavity 1057 is formed with viahole conductors 1058 in the thickness direction of the main body 1051 for electrically connecting the top surface side of the main body 1051 and the cavity 1057. A sealing conductive layer 1059 for sealing the metal cover 1054 is formed on the top surface of the ceramic substrate 1055. A wiring conductor 1060 including an IC electrode pad is formed on the ceiling surface of the cavity 1057. Further, external terminal electrodes 1061, 1062, 1063, 1064 are formed on the opposite longer sides of the bottom surface of the rectangular hollow member 1056. Four recesses extending up to the bottom surface of the rectangular hollow member 1056 are formed in the opposite shorter sides of the rectangular hollow member 1056, and terminal electrodes 1065 to 1068 are formed on the inner wall surfaces of these recesses. The terminal electrodes 1065 to 1068 are adapted to write temperature compensation data or other data in an IC (integrated circuit) chip 1053 mounted on the cavity 1057.

The rectangular crystal oscillating element 1052 is electrically coupled to the top surface of the main body 105 via mounts 1069 and 1070 using conductive resin adhesives 1071, 1072, and the metal cover 1054 substantially in the form of a dish is integrally coupled using the sealing conductive layer 1059 in order to hermetically seal the crystal oscillating element 1052. The IC chip 1053 is bonded to an IC electrode pad via a bump or a bonding wire. In the cavity 1057, resin 1073 is filled and cured, so that the IC chip 1053 is completely covered to have an improved resistance to humidity. In the aforementioned construction, the crystal oscillating element 1052 mounted on the top surface of the main body 1051 is connected with the IC chip 1053 via the viahole conductors 1058, and the IC chip 1053 is connected with the external terminal electrodes 1061 to 1064 and the temperature compensation data writing terminal electrodes 1065 to 1068 via the wiring conductors 1060. The IC chip 1053 and the terminal electrodes 1065 to 1068 are connected via the wiring conductor 1060 formed on a plane of the bottom surface side of the ceramic substrate 1055, and the IC chip 1053 and the external terminal electrodes 1061 to 1064 are connected by the viahole conductors 1058 extending through the thickness of the rectangular hollow member 1056, utilizing the inner wall surface of the hollow member 1056.

In the above crystal oscillator, the rectangular IC chip 1053 is used as a control circuit for controlling the oscillation of the crystal oscillating element. Thus, the cavity 1057 of the main body 1051 for accommodating the IC chip 1053 has a rectangular shape. The external terminal electrodes 1061 to 1064 connected to the IC chip 1053 are formed on the opposite longer sides of the bottom of the rectangular hollow member 1056.

However, it is very difficult to realize a stable operation of the crystal oscillator only by the aforementioned IC chip 1053. Specifically, high-frequency noise is likely to be added onto a power supply voltage supplied from an external terminal electrode, e.g., the VCC external terminal electrode 1061. Also, alternating-current components is likely to be added onto an output signal of an external terminal electrode, e.g., the external terminal electrode 1062. These noises can be removed by a large capacity capacitor, which is, however, difficult to integrate into the IC chip 1053.

In the conventional crystal oscillator, in order to avoid the oscillator becoming larger, a capacitor for performing the above operation needs to be mounted side by side with the crystal oscillator on a printed circuit board. However, this complicates the circuit construction of the printed circuit board, and results in increased labor and time to mount this capacitor. Also, an arrangement where electronic devices or chip capacitor, which serves as a capacitor element, are mounted side by side with the IC chip 1053 in the cavity 1057 having the rectangular space results in increase in the size of the cavity 1057. If the cavity 1057 were enlarged while the shape of the crystal oscillator in its top view is kept small, the external terminal electrodes 1061 to 1064 arranged around the cavity 1053 would have to be formed in smaller areas. This considerably reduces a bonding strength when the oscillator is soldered onto a printed circuit board.

In the crystal oscillator, the mounts 1069, 1070 are formed on the top surface, and the substrate having the electrode pad for bonding the IC chip 1053 formed on its bottom surface is constructed as the ceramic substrate 1055. Accordingly, the opposite ends of the viahole conductors 1058 extending along the thickness direction of the ceramic substrate 1055 are exposed to the space for accommodating the crystal oscillating element 1052 and to the ceiling surface of the cavity 1057. In other words, there is no problem if a portion between the ceramic substrate 1055 and the viahole conductors 1058, i.e., between the inner wall of through holes of the ceramic substrate 1055 and the outer circumferential surfaces of the viahole conductors 1058, is completely in close contact. However, this portion may be cracked if thermal coefficient of shrinkage of the ceramic substrate 1055 differs from that of the viahole conductors 1058 or the ceramic substrate 1055 may not necessarily be completely in close contact with the viahole conductors 1058. Even if this portion had been completely airtight before the crystal oscillating element 1052 and the IC chip 1053 were mounted, hermetic reliability is considerably reduced as a result of a plurality of heat treatments, such as during the mounting of the crystal oscillating element 1052, during the stabilization of the frequency of the crystal oscillating element 1052, during the mounting of the IC chip 1053 and during the filling and curing of the resin 1073. Thus, there is a likelihood that the airtight space for accommodating the crystal oscillating element 1052 communicates with the cavity 1057 via cracks formed around the viahole conductor 1058. As a result, the environment of the accommodation space enclosing the crystal oscillating element 1052 changes, thereby changing the oscillation characteristic.

An essential point in conventional construction in which the crystal oscillating element 1052 and the IC chip 1053 are mounted in different accommodation cavities to avoid an increase in height. Japanese Unexamined Patent Publication No. 10-28024 proposes a construction with which strength will not be reduced even if the metal cover is thinned. In other words, a dish-shaped metal cover formed with projections is used.

In keeping the height of the crystal oscillator low, a support construction for the crystal oscillating element mounted on the surface of the ceramic substrate 1055 is essential. A construction having a lowest height has such that crystal oscillating element supports 1069, 1070 are defined by crystal oscillating electrode pads, and the crystal oscillating element 1052 is mounted on the electrode pads using conductive resin adhesive 1071, 1072 including a cap member. With this construction, a spacing Between the top surface of the substrate 1055 and the crystal oscillating element 1052 corresponds to substantially the height of the cap member and a spacing Between the top surface of the crystal oscillating element 1052 and the metal cover 1054 can be defined by the shape of the metal cover.

However, in the case where the crystal oscillating element 1052 is mounted on the oscillating element electrode pad by the conductive resin adhesive 1071, 1072, conductive resin adhesive fed by a dispenser is liable to spread planarly. The spread conductive resin adhesive may come into contact with a sealing conductive layer which is arranged on the periphery of the top surface of the substrate 1055, resulting in unstable oscillation frequencies. This sealing conductive layer 1059 is adapted to couple the metal cover 1054 onto the substrate 1055. Accordingly, the use of conductive resin adhesive to couple them together is obvious since the sealing conductive layer 1059 and the element electrode pad are formed on the top surface of the substrate 1055 in proximity to each other to make the crystal oscillator smaller in its top view.

Further, it has been very difficult to couple a chip-shaped electronic device having a plane size of 1 mm×0.5 mm in the cavity 1057 of the miniaturized main body 1051 by soldering. Due to the miniaturization of the main body 1051, specifically, such an electronic device is accommodated in the same cavity 1057 in very proximity to each other. Thus, flux contained in solder paste for bonding the electronic device may deposit on the IC electrode pad or the wiring conductor 1060, thereby reducing the bonding reliability of the IC chip 1053 and the IC electrode pad 1060, or causing a short circuit due to solder balls. The use of conductive resin adhesive may be considered instead of soldering. Although conductive resin adhesive advantageously solves the aforementioned problems brought by the soldering, there is no sufficient self-alignment resulting from a surface tension which acts during the fusion of solder. As a result, it becomes very difficult to mount the chip-shaped electronic device in a specified tiny portion of the cavity 1057. Simultaneously, the conductive resin adhesive is likely to spread between a pair of electrode pads, resulting in a short between the pair of electrodes.

There has been known a construction in which an IC chip 1053 is mounted in a cavity 1057 formed in a lower portion of a main body 1051 by face-down bonding method using bumps, and resin is filled between the IC chip and the bottom surface of the cavity 1057. FIG. 30 shows a temperature compensating crystal oscillator mounted with an IC chip for performing a temperature compensation for a crystal oscillating element. In this crystal oscillator, an IC chip 1214 formed with gold bumps 1213 is accommodated in a cavity 1212 of a main body 1211 formed by placing a multitude of ceramic layers one on top of another, so that the gold bumps 1213 are in contact with electrode pads (not shown) on the ceiling surface of the cavity 1212. The IC chip 1214 is bonded to the bottom surface of the cavity 1212 of the main body 1211 via the gold bumps 1213 and the electrode pads by adhesion using silver paste or ultrasonic fusion. However, the bonding strength is so low that the IC chip 1214 is peeled off by the weight of 6 g per bump if it is bonded only by silver-paste adhesion or ultrasonic fusion. Accordingly, a thermosetting resin 1215 having a high coefficient of shrinkage which is called underfill resin is filled between the IC chip 1214 and the ceiling surface of the cavity 1212. As the resin is cured, the IC chip 1214 is fixed to the ceiling surface of the cavity 1212. Although unillustrated, the crystal oscillating element is mounted on the surface of the main body 1211 opposite from the cavity 1212 and hermetically sealed.

As shown in FIG. 31, the thermosetting resin 1215 contracts in directions of arrows in the conventional crystal oscillator. This contraction produces a stress F in a direction to pull the IC chip 1214 toward the ceiling surface of the cavity 1212, and the IC chip 1214 is fixed to the ceiling surface of the cavity 1212 only by this force.

In a crystal oscillator shown in FIG. 27, resin 1073 is likely to deposit on a wall surface defining a space of a cavity 1057 when the resin 1073 is filled into the cavity 1057 having the IC chip 1053 bonded therein. Unless a careful attention is paid, the resin 1073 may come out of the cavity 1057. For example, if a resin having excellent adhesiveness is filled to form a bottom layer and a resin having excellent resistance to humidity is filled to form a top layer in order to increase the bonding strength between the IC chip 1053 and the cavity 1057, the resin filled to form the top layer frequently comes out through the opening of the cavity 1057 to deposit on the outer surface around the cavity 1057. If the resin coming out of the cavity 1057 deposits on the outer surface around the cavity 1057, the crystal oscillator becomes defective due to its height deviated from standards. Further, the resin deposits on the external terminal electrodes 1061 to 1064 around the cavity 1057, resulting in defective connection between the crystal oscillator and the printed circuit board.

SUMMARY OF THE INVENTION

It is an object of the present invention to provide a crystal oscillator which has overcome the problems residing in the prior art.

It is another object of the present invention to provide a surface-mount type crystal oscillator which has a main body whose shape is minimized in top view even if a crystal oscillating element is arranged on a top surface of the main body and an IC chip and electronic devices are arranged in a cavity in a lower portion of the main body.

It is still another object of the present invention to provide a surface-mount type crystal oscillator which can maintain stable oscillation characteristics without a hermetic space in which a crystal oscillating element is accommodated, communicating with the cavity.

It is yet another object of the present invention to provide a thin small-sized crystal oscillator which has stable characteristics and is free from a short circuit between a sealing conductive layer and an oscillating element electrode pad.

It is further another object of the present invention to provide a crystal oscillator which can prevent a short circuit between a pair of electrodes used for connecting an electronic device and to sufficiently narrow a spacing between this electronic device and another electronic device.

It is still further object of the present invention to provide a crystal oscillator which has a high reliability in bonding an IC chip to a main body.

It is yet further object of the present invention to provide a crystal oscillator which has no resin coming out of a cavity for accommodating an IC chip.

According to an aspect of the present invention, a surface-mount type crystal oscillator comprises a main body formed with a cavity in a lower portion thereof, the cavity being partitioned from a top surface of the main body by a partition wall; a crystal oscillating element mounted on the top surface; a controlling IC chip and an electronic device accommodated in the lower cavity; and a plurality of terminal electrodes provided on the main body around the lower cavity, the opposite terminal electrodes being spaced from each other by a specified distance to define a separating area therebetween. The cavity has a bulging space portion bulging into the separating area between the opposite terminal electrodes.

Since the bulging space portion is formed in the separating area between the opposite terminal electrodes in this construction, the IC chip and the electronic device can be accommodated in the cavity while effectively utilizing a space provided by the bulging space portion, and it is not necessary to reduce the size of the terminal electrodes provided around the cavity. Thus, a predetermined or more connection strength with necessary components can be ensured while the size of the crystal oscillator, particularly the shape thereof in plan view, is kept small.

The main body may be constructed by an upper unit having a top surface defining the top surface of the main body, and a lower unit formed with the cavity. An opening of the cavity is closed by the bottom surface of the upper unit. In this construction, significant two components constituting a crystal oscillator can be separately prepared, consequently increasing the production efficiency of crystal oscillators.

Preferably, a groove may be formed around a mount electrode formed on the top surface. With this construction, even if conductive resin paste or the like supplied to the mount electrode spreads beyond the mount electrode when the crystal oscillating element is placed thereon, superfluous conductive resin paste is taken up by the groove. Thus, even in a construction where a sealing conductive layer is provided near the mount electrode in order to reduce the height of the crystal oscillator, the mount electrode and the sealing conductive layer are not short-circuited by the conductive resin paste or the like owing to the presence of the groove. This construction is particularly effective for a small-sized crystal oscillator in which mount electrodes and a sealing conductive layer are formed close to each other.

It may be preferable to form a pair of device mount electrodes for mounting an electronic device in the cavity with a notch at its outer side. The provision of the respective notches at the outer sides of the pair of device mount electrodes, the flowing direction of the conductive resin paste is determined by these notches. Thus, these notches can prevent the electrodes from being short-circuited, and enable the spacing between the electronic device mounted on the device mount electrodes and other electronic devices to be sufficiently narrowed.

Also, it may be preferable to fill a thermosetting resin into the cavity for sealing under the following conditions. A spacing between a side surface of the IC chip and the side surface of the cavity is smaller than the thickness of the IC chip. The outside surface of the resin is inner than an outermost end of the cavity, and is outer than the outer surface of the IC chip. A gap between the outer surface of the IC chip and the outside surface of the filled resin is smaller than a gap between the inner surface of the IC chip and the inner laterally extending surface of the cavity.

A stress pushing the IC chip decreases as the spacing between the IC chip and the side surface of the cavity increases, and becomes constant when the spacing exceeds the thickness of the IC chip. As the gap between the outer surface of the IC chip and the outside surface of the resin becomes smaller than the gap between the IC chip and the inner laterally extending surface of the cavity, the coefficient of shrinkage of the resin above the IC chip becomes larger than that of the resin therebelow. This actually increases the bonding strength of the IC chip to the main body.

Further, it may be preferable to seal the cavity by filling a sealing resin thereinto, and form an outermost end of the cavity with a step for preventing the sealing resin from coming out of the lower cavity.

With this construction, when a resin is filled into the cavity, the edge of the step stops the resin creeping up. When another resin is further filled over the previous resin, the creeping-up of this resin is stopped by the opening edge of the cavity. Thus, in comparison to a construction having no step, the resin is likely to stop creeping up at latest at the opening edge of the cavity. Since the step prevents the resin from creeping up, it can be used as a gauge for an amount of the resin to be filled, and can specify a boundary with the resin to be filled on top of it.

BRIEF DESCRIPTION OF THE DRAWINGS

FIGS. 16A to 16H are diagrams showing a process of mounting the electronic devices of the crystal oscillator of FIG. 14, wherein FIGS. 16A, 16C, 16E and 16G are partial top views, and FIGS. 16B, 16D, 16F and 16H are partial side views;

FIGS. 17A to 17H, corresponding to FIGS. 16A to 16H, are diagrams showing a conventional mounting process, wherein FIGS. 17A, 17C, 17E and 17G are partial top views and FIGS. 17B, 17D, 17F and 17H are partial side views;

FIGS. 26A to 26D show further surface-mount type crystal oscillator embodying the invention, wherein FIG. 26A is a side view in section partly cut away, FIG. 26B is a bottom view of an upper unit of the crystal oscillator, FIG. 26C is a top view of a lower unit of the crystal oscillator, and FIG. 26D is a bottom view of the lower unit;

DETAILED DESCRIPTION OF THE PREFERRED EMBODIMENTS OF THE INVENTION

Figure 1:
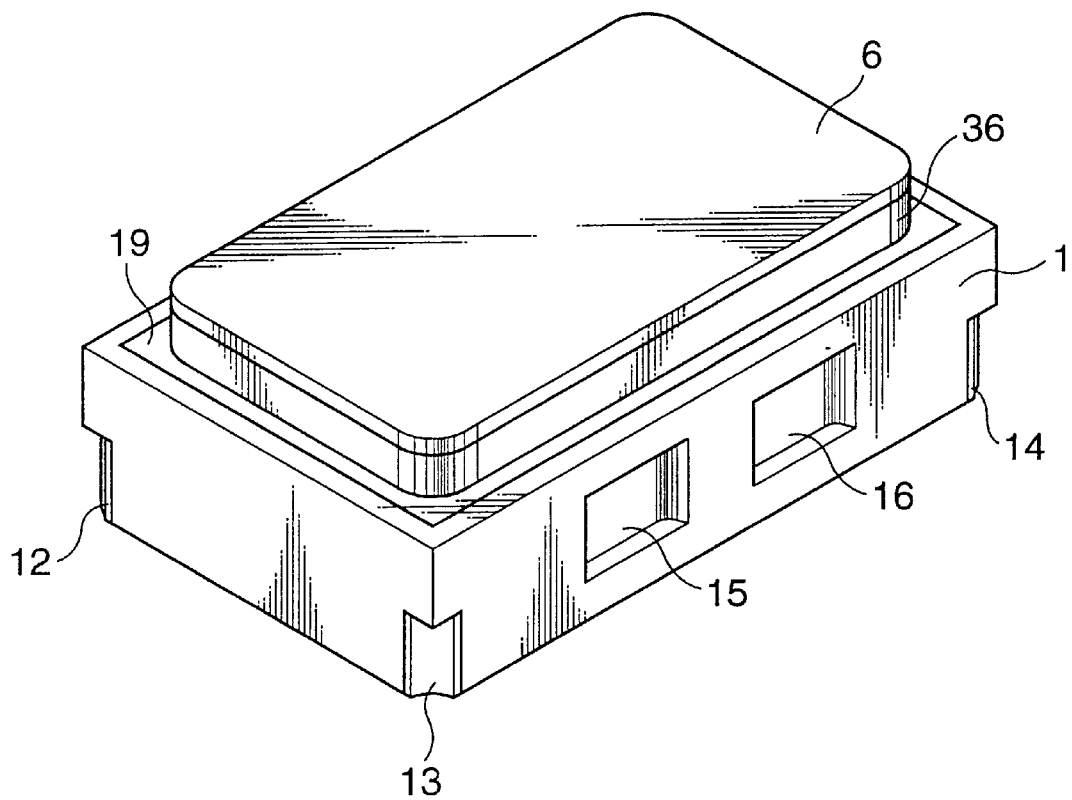
FIG. 1 is a perspective view showing an external configuration of a surface-mount type crystal oscillator embodying the invention.
Figure 2:
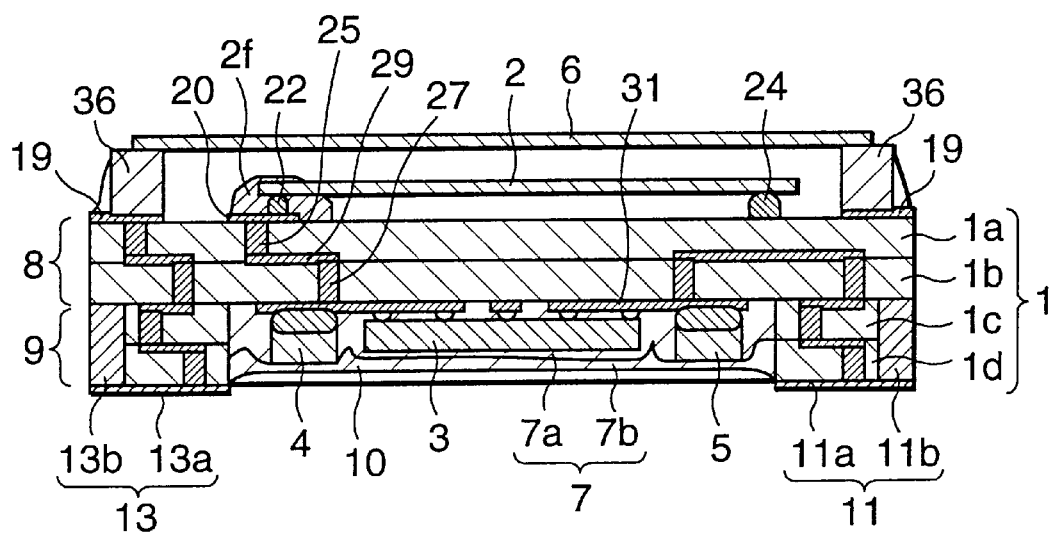
FIG. 2 is a sectional view of the crystal oscillator of FIG. 1.
Figure 3:
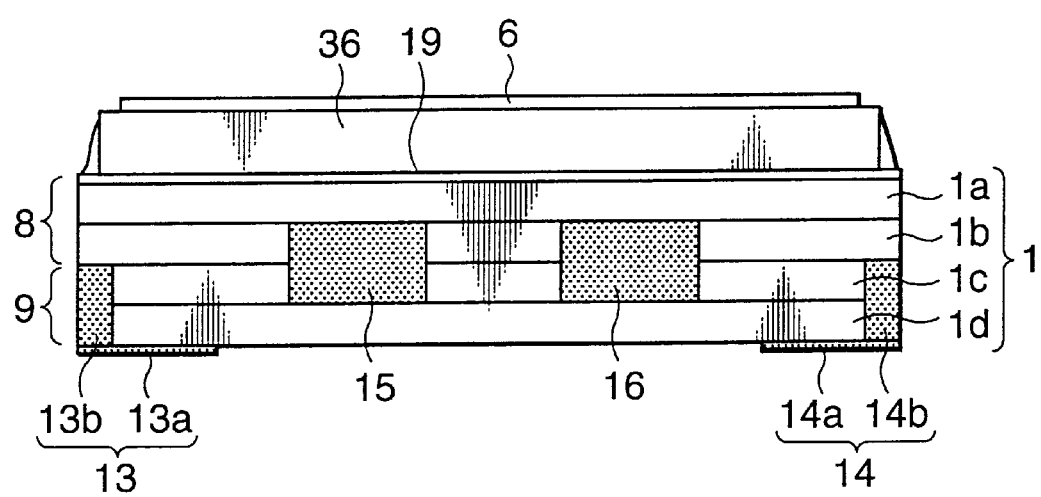
FIG. 3 is a side view of the crystal oscillator of FIG. 1.
Figure 4:
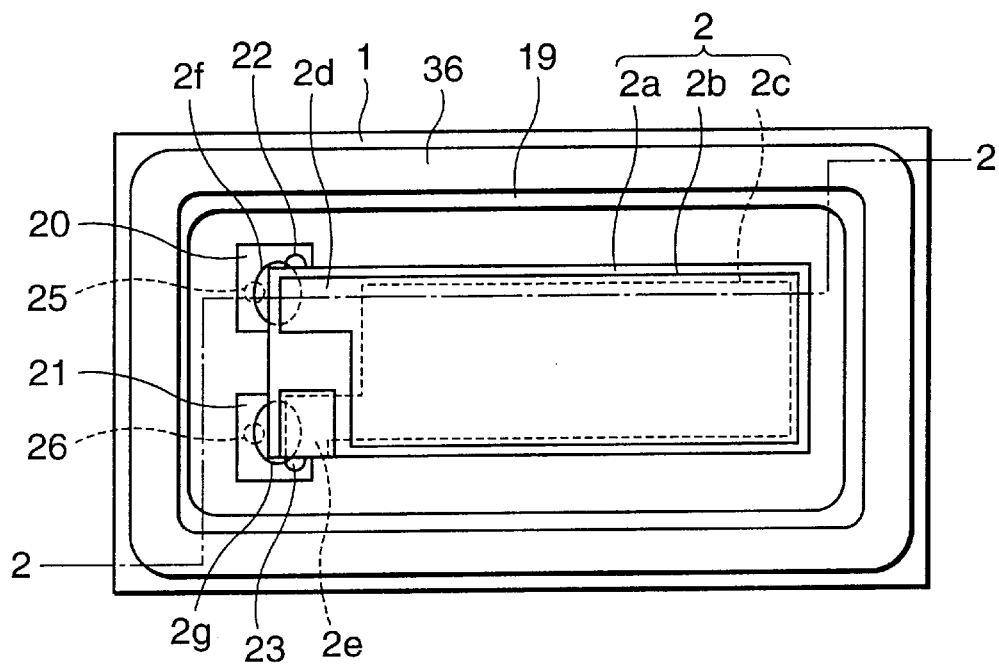
FIG. 4 is a top view of the crystal oscillator of FIG. 1, a cover being removed.
Figure 5:
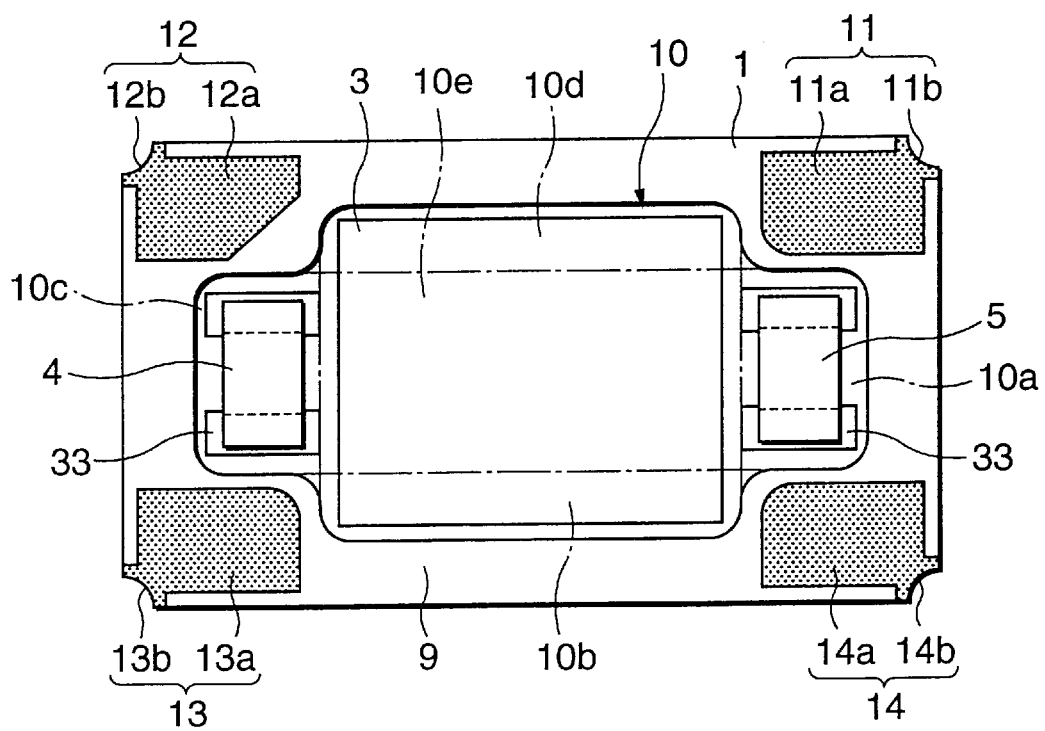
FIG. 5 is a bottom view of the crystal oscillator of FIG. 1, a resin being removed.
Figure 6:
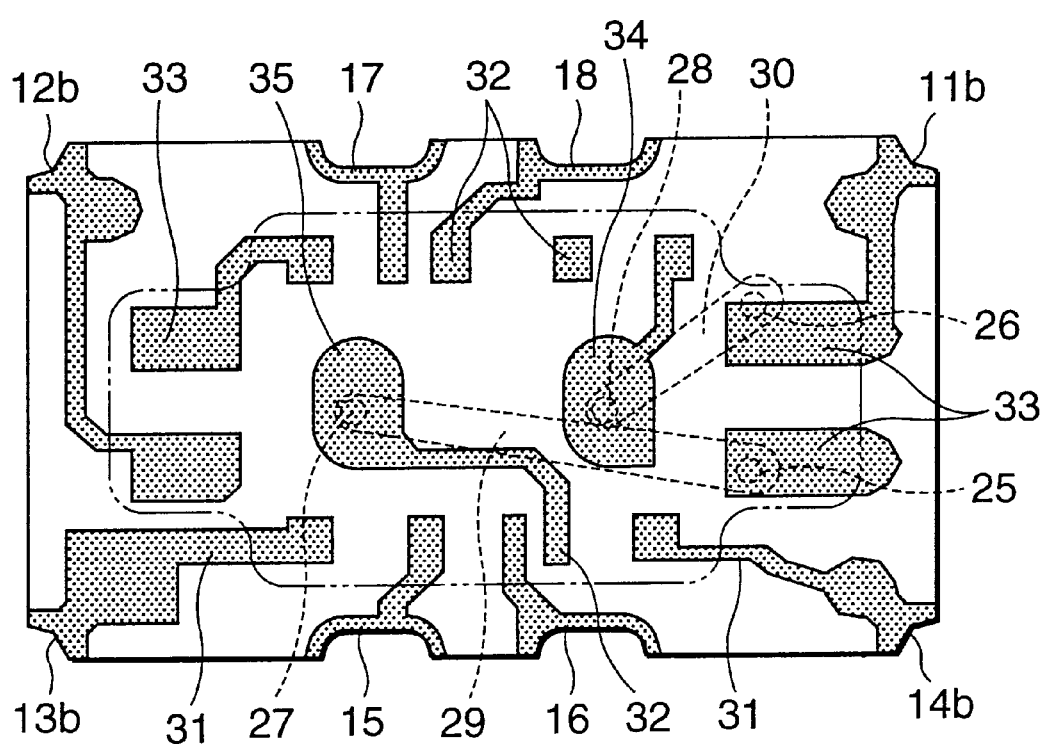
FIG. 6 is a schematic diagram showing internal wiring conductors of the crystal oscillator of FIG. 1.

A crystal oscillator embodying the invention will be described in detail with reference to the accompanying drawings. FIG. 1 shows an external configuration of the crystal oscillator; FIG. 2 shows a section of the crystal oscillator; FIG. 3 shows a side view of the crystal oscillator; FIG. 4 shows a top view of the crystal oscillator without a cover thereof; FIG. 5 is a bottom view of the crystal oscillator without a resin; and FIG. 6 shows a construction of internal wiring conductors of the crystal oscillator. It should be noted that FIG. 2 is a section taken along the 2—2 in FIG. 4.

In this embodiment, the crystal oscillator is provided with a control circuit for performing a temperature compensation to flatten a temperature-frequency variation characteristic of a crystal oscillating element.

More specifically, the temperature compensating crystal oscillator is mainly comprised of a substantially box-shaped main body 1, a rectangular crystal oscillating element 2, a controlling IC chip 3 constituting a control circuit, two electronic devices 4, 5, a metal cover 6, and a covering resin 7.

The main body 1 is constructed by placing substantially rectangular ceramic insulating layers 1a, 1b and hollow ceramic insulating layers 1c, 1d one on another integrally. The hollow ceramic insulating layers 1c and 1d each are formed with a peculiar space. The ceramic insulating layers 1a, 1b form a partition 8 for partitioning the crystal oscillating element 2 from the IC chip 3 and the electronic devices 4, 5, whereas the ceramic insulating layers 1c, 1d form a rectangular hollow member 9. A cavity 10 is defined by a bottom surface of the partition 8 and inner walls of the space of the rectangular hollow member 9.

External terminal electrodes 11 to 14 are formed at four corners of the bottom surface of the main body 1. In the opposite longer sides of the main body 1 are formed terminal electrodes 15 to 18 for IC-control to write necessary temperature compensation data and a variety of pieces of information for control in the IC chip 3.

A sealing conductive layer 19 is formed on the periphery of the top surface of the main body, i.e., the top surface of the partition 8. Oscillating element electrode pads 20, 21 to be connected with the crystal oscillating element 2 are arranged side by side near one longitudinal end of the top surface of the main body 1. On the electrode pads 20, 21 are formed connection bumps 22, 23 for spacing the crystal oscillating element 2 from the top surface of the main body 1 by a specified distance. Further, a holding bump 24 for supporting the other end of the crystal oscillating element 2 is formed near the other longitudinal end of the top surface of the main body The ceramic insulating layer 1a is formed with two first viahole conductors 25, 26 (but first viahole conductor 26 is not shown in FIG. 2) connected with the electrode pads 20, 21, and the ceramic insulating layer 1b is formed with second viahole conductors 27, 28 (but second viahole conductor 28 is not shown in FIG. 2) exposed at the ceiling surface of the cavity 10. Between the layers 1a and 1b are formed internal wiring conductors 29, 30 (but conductor 30 is not shown in FIG. 2) for connecting the viahole conductors 25 and 27 and the viahole conductors 26 and 28. Further, on the bottom surface of the ceramic insulating layer 1b are formed various wiring conductors 31 for connecting the IC chip 3 with the IC control terminal electrodes 15 to 18, for connecting the IC chip 3 with the electronic devices 4, 5 and for connecting the IC chip 3 and the electronic devices 4, 5 with the external terminal electrodes 11 to 14. Further, on the ceiling surface of the cavity 10 are formed a plurality of IC electrode pads 32, a plurality of device electrode pads (hereinafter, referred to as "electrode portion")33, monitor electrode pads 34, 35.

In the main body 1 are defined two conductive paths each of which has one end on the top surface of the partition 8 and the other end on the ceiling surface of the cavity 10. More specifically, the one conductive path is defined by the first viahole conductor 25, the internal wiring conductor 29, and the second viahole conductor 27. The other conductive path is defined by the first viahole conductor 26, the internal wiring conductor 30, and the second viahole conductor 28. In this way, the oscillating element electrode pads 20, 21 are electrically connected with the IC electrode pads 32, 32 and the monitor electrode pads 34, 35 by the way of the conductive paths and the wiring conductors 31, 31 on the ceiling surface of the cavity 10.

The external terminal electrodes 11 to 14 are comprised of horizontal portions 11a to 14a formed at the four corners of the bottom surface of the main body 1 and vertical portions 11b to 14b, which are formed at inner walls of recesses formed by cutting off a sector of about 90° from the four corners of the ceramic insulating layers 1c, 1d and extend in the thickness direction, respectively. The external terminal electrode 13 at ground potential needs to be connected with the sealing conductive layer 19 formed on the top surface of the main body 1 to cause the metal cover 6 to have a shielding effect. As shown in FIG. 2, thus, the external terminal potential 13 at ground potential is connected with the sealing conductive layer 19 by the viahole conductor extending through all the ceramic insulating layers 1a to 1d, and the internal wiring conductors. Alternatively, the vertical portion 13b of the external terminal electrode 13 is extended up to the top surface of the main body 1 so as to connect with the sealing conductive layer 19.

The IC control terminal electrodes 15 to 18 are formed not in the ceramic insulating layers 1a, 1d, but on the end surfaces of the longer sides of intermediate layer held between the ceramic insulating layers 1a and 1d, i.e., the ceramic insulating layers 1b, 1c. Accordingly, the IC control terminal electrodes 15 to 18 (only 15 and 16 in FIG. 3) in the opposite sides of the main body 1 are not in contact with the top and bottom surfaces of the main body 1. This is to avoid a short circuit with the sealing conductive layer 19 formed on the top surface and to avoid a short circuit with wiring conductors on a printed circuit board when the crystal oscillator is soldered to the printed circuit board. It is desirable to form the IC control terminal electrodes 15 to 18 on inner wall surfaces of recesses formed in the longer sides of the ceramic insulating layers 1b, 1c. This prevents an occurrence of an erroneous temperature compensation due to alteration of written data caused by an external factor such as contact of the crystal oscillator with a conveyor for conveying it onto a printed circuit board, or a short between the crystal oscillator and a printed circuit board. Further, this will assure stable contact of a data writing head onto the IC control terminal electrodes 15 to 18.

The main body 1 is made of ceramic green sheets, which are to become the ceramic insulating layers 1a to 1d. Specifically, through holes for the first viahole conductors 25, 26 are formed in a rectangular ceramic which is a green sheet to become the insulating layer 1a, and metal paste having a high melting point such as molybdenum or tungsten is filled in these through holes. Simultaneously, conductive thin layers to become the electrode pads 20, 21, those to become bumps 22 to 24 and the one to become sealing conductive layer 19 are formed on the top surface of the main body 1 by printing metal paste.

In a rectangular ceramic which is a green sheet to become the insulating layer 1b are formed through holes for the second viahole conductors 27, 28 and recesses in which the IC control terminal electrodes 15 to 18 are formed. The through holes are filled and conductive thin layers are formed on the inner wall surfaces of the recesses by the aforementioned high melting-point metal paste. Simultaneously, conductive thin layers to become the IC electrode pads 32, the electrode portion 33, the monitor electrode pads 34, 35 and the internal wiring conductors 29, 30 for connecting electrode pads 32, 33, 34 and 35 with the respective terminal electrodes 11 to 18 to construct a specified circuitry, and the wiring conductors 31, 31 are formed on the surface of this green sheet which serves as the ceiling surface of the cavity 10.

Further, conductive thin layers to become the internal wiring conductors 29, 30 for connecting the first viahole conductors 25, 26 and the second viahole conductors 27, 28 are formed on the joint surface of either of green sheets to serve as the ceramic insulating layers 1a or 1b by printing metal paste.

Notches for the vertical portions 11b to 14b of the external terminal electrodes 11 to 14 and recesses for the IC control terminal electrodes 15 to 18 are formed in a green sheet formed with a space having the peculiar shape. This green sheet is to become the ceramic insulating layer 1c. Conductive thin layers are formed on inner walls of these notches and recesses using metal paste.

Notches for the vertical portions 11b to 14b of the external terminal electrodes 11 to 14 are formed in a green sheet formed with a space having the peculiar shape. This is to become the ceramic insulating layer 1d. Conductive thin layers are formed on inner walls of these notches using metal paste. Simultaneously, Conductive thin layers to become the substantially rectangular horizontal portions 11a to 14a of the external electrode terminals 11 to 14 are formed at the four corners of the bottom surface of this green sheet. It should be noted that the horizontal portions 11a to 14a are so formed as to be connected with the vertical portions 11b to 14b for electrical connection.

Sintering is performed after the respective green sheets thus prepared are stacked one on top of another and pressed together. The degree of evenness of the top surface of the main body 1 and the ceiling surface of the cavity 10 is particularly essential since the crystal oscillating element 2 is mounted on the top surface of the main body 1 and the IC chip 3 is mounted in the cavity 10. In the pressing process, pressing is applied using the top surface of the main body 1 as a reference surface. In order to press the ceiling surface of the cavity 10 at a uniform pressure, an auxiliary filler member may be filled in the cavity 10, or pressing may be applied using a punch having a head formed with a flat top surface, or the insulating layers 1a, 1b and the insulating layers 1c, 1d may be separately pressed and then adhered together.

Subsequently, nickel plating or gold plating is applied to the external terminal electrodes 11 to 14, the IC control terminal electrodes 15 to 18, the sealing conductive layer 19, the electrode pads 20, 21, the IC electrode pads 32, the electrode portion 33, the monitor electrode pads 34, 35 and the various wiring conductors 31 and the bumps 22 to 24 which are exposed to the outside of the main body 1, thereby completing the main body 1.

It may be appreciated to connect the external terminal electrode 13, which serves as a ground potential, with the sealing conductive layer 19 by way of viahole conductors penetrating the ceramic insulating layers 1a to 1d and internal wiring conductors, which are formed during the formation of the viahole conductors 25 to 28 or during the formation of the internal wiring conductors 29 to 31. Alternatively, it may be appreciated to form a conductive thin layer formed on a notch formed in one corner of each ceramic insulating layer 1a, 1b so as to extend the vertical portion of the external terminal electrode up to the sealing conductive layer 19. Particularly, in connecting the external terminal electrode 12 which serves as a VCC terminal through which a large current can flow with the wiring conductor 31, it is preferable to form viahole connectors not only at one corner of the ceramic insulating layers 1c, 1d, but also in the rectangular hollow member 9.

Although the connection bumps 22, 23 and the holding bump 24 are formed at one and the other ends of the electrode pads 20, 21 by printing the conductive paste on the top surface of the main body 1, they may be formed by applying and depositing conductive paste containing silver powder or by applying and curing resin paste containing silver powder. In order to cause the connection bumps 22, 23 to have a specified height, the paste may be applied a plurality of times. The height from the top surface of the main body 1 to the top of the connection bumps 22, 23 is 15 to 30 $\mu$m, and the height from the top surface of the main body 1 to the top of the holding bump 24 is smaller than the height of the connection bumps 22, 23, preferably by 5 to 10 $\mu$m.

A seam member 36 which is a substantially rectangular metal frame is bonded to the sealing conductive layer 19. The seam member 36 is made of Fe—Ni alloy, Fe—Ni—Co alloy, or phosphor bronze, etc., and has a construction in conformity with the configuration of the sealing conductive layer 19. The seam member 36 is bonded to the sealing conductive layer 19 by wax.

The crystal oscillating element 2 is arranged on the top surface of the above-prepared main body 1. The crystal oscillating element 2 is comprised of oscillating electrodes 2b, 2c formed on both principle surfaces of a rectangular crystal plate 2a, e.g., an AT-cut, and lead electrodes 2d, 2e in the form of projections extending from the oscillating electrodes 2b, 2c to the other end. It should be noted that the oscillating electrodes 2b, 2c on the bottom surface are indicated by broken lines in FIG. 4. The lead wires 2d, 2e are connected with the electrode pads 20, 21 via conductive resin adhesives 2f, 2g.

The oscillating electrodes 2b, 2c and the lead electrodes 2d, 2e are made by forming base layers of chromium or nickel on the opposite surfaces of the crystal plate 2a and top layers of conductive material such as silver or gold by deposition, spattering or other thin layer formation technique.

The crystal oscillating element 2 mounted on the top surface of the main body 1 is hermetically sealed by the metal cover 6. The metal cover 6 is made of a metal material such as Fe—Ni—Co alloy or Fe—Ni alloy, and has a specified thickness, e.g., 0.1 mm. The metal cover 6 is brought into close contact with and welded with the seam member 36 bonded to the sealing conductive layer 19 on the top surface of the main body 1 by wax. Nickel, aluminum or the like is deposited on an outer principle surface of the metal cover 6 in order to prevent melted wax from flowing onto the outer principle surface of the metal cover 6 and make wax to melt easily during welding, thereby realizing stable and strong welding.

The IC chip 3 constituting the control circuit is mounted on the ceiling surface of the cavity 10 of the main body 1. The IC chip 3 performs such a control as to flatten a variation in the frequency of the crystal oscillating element 2, which is due to an intrinsic temperature-frequency variation characteristic represented by, e.g., a three-mode curve, over a wide temperature range including the normal temperature. Specifically, the IC chip 3 is made by treating a silicon chip by known PN doping. The IC chip 3 includes an oscillating inverter constructing an oscillating circuit, a load capacitor, a feedback resistance, a memory for storing temperature compensation data necessary to flatten the intrinsic temperature-frequency variation characteristic of the crystal oscillating element 2, a temperature sensor for detecting ambient temperature, a varicap diode, a generator for generating a voltage to the varicap diode based on a detected ambient temperature and specific temperature compensation data, an analog-to-digital (A/D) converter for converting a write signal from outside into digital data so as to be stored in the memory, and a processor for controlling the operations of the above devices.

The IC chip 3 includes a VCC terminal to which a supply voltage is supplied, a GND terminal which is at ground potential, two crystal connecting terminals to be connected with the crystal oscillating element 2, an OUT terminal for oscillation output, a VCON terminal for enabling frequency adjustment from outside, and four temperature compensation data writing control terminals 15 to 18 for writing the compensation data.

The VCC terminal (power supply) of the IC chip 3 is electrically connected with the external terminal electrode 12 via the IC electrode pad 32, the wiring conductor 31, and the internal wiring conductors. The OUT terminal is electrically connected with the external terminal electrode 11 via the IC electrode pad 32, and the wiring conductor 31, and the internal wiring conductors. The GND terminal electrically connected with the external terminal electrode 13 via the IC electrode pad 32, the wiring conductor 31, and the internal wiring conductors. The VCON terminal is electrically connected with the external terminal electrode 14 via the IC electrode pad 32, the wiring conductor 31, and the internal wiring conductors. Further, two crystal oscillation terminals are respectively electrically connected with the electrode pads 20, 21 on the top surface of the main body 1 via the IC electrode pads 32, the wiring conductors 31, the monitor electrodes 34, 35, and the conductive paths. The four data writing control terminals are respectively electrically connected with the IC control terminal electrodes 15 to 18 via the IC electrode pads 32, the wiring conductor 31, and the internal wiring conductors.

These terminals are formed, for example, as aluminum electrodes on the mounting surface of the IC chip 3. The IC chip 3 is mounted in the cavity 10 as follows. Bumps of gold, solder or like material are formed on the respective aluminum electrodes, and are bonded and connected with the aforementioned IC electrode pads 32 by ultrasonic bonding or using conductive filler. Alternatively, the respective aluminum electrodes are formed on the upper surface of the IC chip 3, and then connected with the corresponding IC electrode pads 32 via, for example, bonding wires. However, with the latter, attention should be paid lest the cavity 10 should become larger in shape.

The electronic devices 4, 5 are, for example, electronic devices such as chip-shaped capacitors. They are joined between the pair of electrode portions 33, 33 using conductive resin adhesive containing silver powder or solder.

The electronic device 4 or capacitor is electrically connected between the IC chip 3 and the VCC external terminal electrode 12 in such a way that one end thereof is at ground potential. This is to remove high-frequency noise to be added onto a power supply voltage supplied to the VCC external terminal electrode 12.

The electronic device 5 or capacitor is electrically connected between the IC chip 3 and the OUT external terminal electrode 11. This is to remove alternating-current components which become noise in an output signal.

In the cavity 10, the IC chip 3 and the two electronic devices 4, 5 are so juxtaposed as to minimize the mounting space in conformity with the shape of the cavity 10 as described later.

In the cavity 10 is filled the resin 7 in order to strongly bond the IC chip 3 and the electronic devices 4, 5 and to improve reliability in resistance to humidity. For example, the resin 7 is made of at least two kinds of resins and is comprised of a resin layer 7a filled and cured at the ceiling surface of the cavity 10 and a resin layer 7b filled and cured on the resin layer 7a. Specifically, the resin layer 7a is made of a resin material having a relatively large coefficient of shrinkage and containing a large quantity of resin components such as epoxy resin generally called underfill resin. This resin layer 7a is formed by filling and curing to the extent that it completely covers at least the upper surface of the IC chip 3.

More specifically, the IC ship 3 and the electronic devices 4, 5 can be more strongly bonded by a stress produced by the expansion and shrinkage of the resin layer 7a filled between them and the ceiling surface of the cavity 10. Further, a stress produced by the expansion and shrinkage of the resin layer 7a formed to completely cover the IC chip 3 acts on the IC chip 3. This stress acts to press the IC chip 3 against the ceiling surface of the cavity 10 from above the IC chip 3, thereby improving the bonding strength of the IC chip 3 to the ceiling surface of the cavity 10.

The resin layer 7b is formed to solve problems of, e.g., insufficient resistance to humidity which are caused by the thinning of the resin layer 7a for covering the IC chip 3 and the electronic devices 4, 5 due to its large shrinkage stress. By the resin layer 7b, the IC chip 3 and the electronic devices 4, 5 mounted in the cavity 10 are allowed to have a better bonding strength and better reliability in resistance to humidity.

The resin 7 should not project out through the opening plane of the cavity 10 in order to stably place the temperature compensating crystal oscillator on the printed circuit board.

In the crystal oscillator thus constructed, only the IC chip 3 and the two electronic devices 4, 5 are mounted in the cavity 10 in the lower portion of the main body 1 as shown in FIG. 5 in which the resin 7 is omitted.

In FIG. 5, the IC chip 3 is larger than the two electronic devices 4, 5 in plan view. The crystal oscillator is characterized in the arrangement of the IC chip 3 and the two electronic devices 4, 5 to minimize the mounting space and the bottom construction of the main body 1, i.e., the shape of the space of the cavity 10 and the arranged positions of the external terminal electrodes 11 to 14.

For arrangement of an IC chip and electronic devices each having a rectangular shape in a minimized space, it would be usually considered to form the accommodation space into a rectangular shape. However, if the rectangular cavity is merely formed to accommodate rectangular IC chip and electronic devices as in the prior art, there will be the problem that the position and the size of external terminal electrodes to be around the cavity 1057 are restricted. This compels the bottom area of the main body 1051 to be increased or the external electrode terminals 1061 to 1064 to be reduced in size.

In view of the problem, in this embodiment, the IC chip 3 and the electronic devices 4, 5 are mounted in the cavity 10 in such a way that the IC chip 3 larger in top view is in the middle and the electronic devices 4, 5 smaller in plan view are arranged around or at the sides of the IC chip 3.

Specifically, the electronic device 4, the IC chip 3 and the electronic device 5 are arranged along a center line of the main body 1 with respect to its width (the line extending transversely of FIG. 5). Since the electronic devices 4, 5 are smaller, the electronic devices 4, 5 and the IC chip 3 form a substantially cross-like shape as a whole. For this reason, in this embodiment, the space of the cavity 10 is the peculiar shape of a substantially cross in plan view so as to be similar to the arrangement of the electronic devices 4, 5 and the IC chip 3.

The cavity 10 having the substantially cross-shaped space is formed in the rectangular lower portion of the main body 1, and the external terminal electrodes 11 to 14 are arranged at four corner portions of the main body 1 defined between the rectangular bottom surface of the main body 1 and the cross-shaped cavity 10.

In FIG. 5, the cavity 10 has a bulging space portion 10a in a separating area between the opposite two external terminal electrodes 11 and 14, and the electronic device 5 is mainly arranged in the bulging space portion 10a. The cavity 10 also has a bulging space portion 10c in a separating area between the opposite two external terminal electrodes 12 and 13, and the electronic device 4 is mainly arranged in the bulging space portion 10c.

Further, the cavity 10 has bulging space portions 10b, 10d in a separating area between the opposite two external terminal electrodes 11 and 12 and that between the opposite two external terminal electrodes 13 and 14. A pair of opposite side portions of the IC chip 3 are arranged in these bulging space portions 10b, 10d. In this way, the whole space of the cavity 10, i.e., the space consisting of a center portion 10e and the four bulging space portions 10a to 10d is minimized more greatly.

As described above, on the rectangular bottom surface of the main body 1 shown in FIG. 5, the IC chip 3 and the electronic devices 4, 5 are mounted in the cross-shaped cavity 10 including the four bulging space portions 10a to 10d and the center portion 10e and the external terminal electrodes 11 to 14 are arranged on the four corner portions which are dead space of the cross-shaped cavity 10. Thus, no space is wasted in the entire bottom surface of the main body 1, and the mounting area of the main body 1 on a printed circuit board can be remarkably made smaller.

The external terminal electrode 12 to which a VCC potential is supplied is arranged at the corner between the bulging space portions 10c and 10d. If the electronic device 4 arranged in the bulging space portion 10c were a capacitor for cutting high-frequency noise components to be added onto a supply voltage, connection by the wiring conductor 31 can be very easily made, and internal wiring conductors 31 can be arranged.

The external terminal electrode 11 which serves as an OUT terminal for outputting the oscillation is arranged on the corner portion formed between the bulging space portions 10a and 10d. If the electronic device 5 arranged in the bulging space portion 10a were a capacitor for cutting alternating-current noise components in an output signal, connection by the wiring conductor 31 can be very easily made and internal wiring conductors can be arranged. Further, since the external terminal electrode 12 which serves as the VCC terminal is arranged at the corner portion between the bulging space portions 10c and 10d. If the electronic device 4 arranged in the bulging space portion 10c were a capacitor for cutting high-frequency noise components in a power supply voltage, connection for the capacitor 4 having one end connected with the power supply can become very easy.

In the conventional crystal oscillator, only the IC chip 1053 is mounted as a circuit for controlling the oscillation in the cavity 1057 in the lower portion of the main body 1051 for miniaturization. In this embodiment, capacitors having a large capacity difficult to be integrated on an IC chip can also be mounted as the chip-shaped electronic devices 4, 5 in the cavity 10 of the main body 1. Thus, the temperature compensating crystal oscillator according to this embodiment can have a reduced number of electronic devices to be mounted on the printed circuit board, and realize easier wiring, contribute to miniaturization required for a mobile communications apparatus or the like, and be very easily handled.

Figure 7:
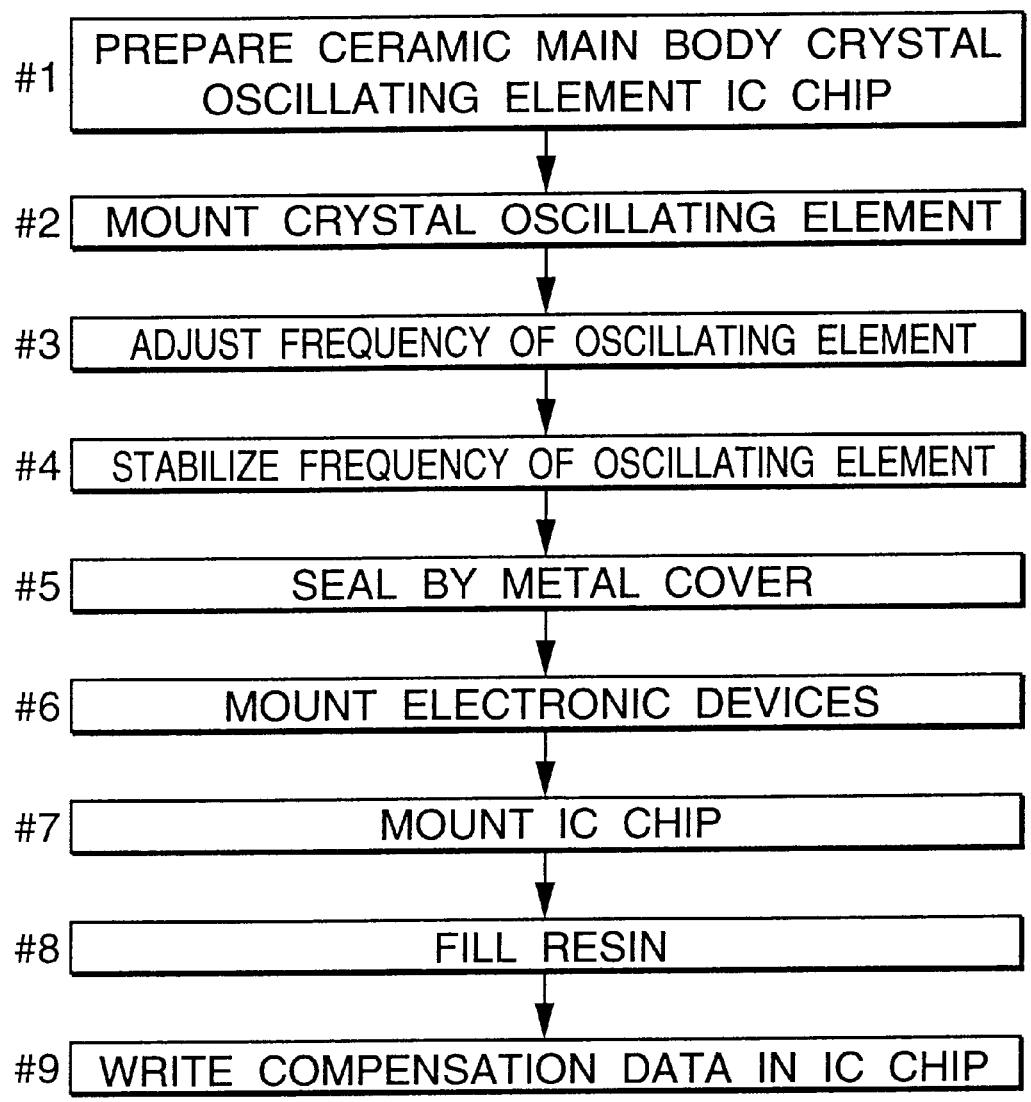
FIG. 7 is a flowchart showing a manufacturing of the crystal oscillator of FIG. 1.

Next, it will be described how the crystal oscillator is assembled with reference to FIG. 7.

In Step #1, a main body 1 formed with IC control terminal electrodes 15 to 18, element electrode pads 20, 21, various wiring conductors (conductors, electrode pads, viahole conductors, monitor electrode pads) 19, 25 to 35 and a seam member 36 formed thereon by deposition, a crystal oscillating element 2, a metal cover 6, an IC chip 3 having gold bumps formed by deposition, and electronic devices 4, 5 are prepared.

Subsequently, the crystal oscillating element 2 is mounted in Step #2. Specifically, conductive paste is applied to the element electrode pads 20, 21 located in a space enclosed by the seam member 36; one end of the crystal oscillating element 2, i.e., lead electrodes 2d, 2e of the crystal oscillating element 2 are positioned with respect to the oscillating element electrode pads 20, 21; and conductive paste is cured by a specified curing method (heat curing or ultraviolet curing). As a result, the oscillating electrodes 2b, 2c of the crystal oscillating element 2 are connected with monitor electrodes 34, 35 exposed at the ceiling surface of the cavity 10 of the main body 1 via the element electrode pads 20, 21, viahole conductors 25, 26, internal wiring conductors 29, 30, and viahole conductors 27, 28.

Subsequently in Step #3, the frequency of the crystal oscillating element 2 is adjusted. Specifically, measuring terminals or probes of a frequency meter are brought into contact with the monitor electrodes 34, 35 exposed at the ceiling surface of the cavity 10 of the main body 1, and the crystal oscillating element 2 is caused to oscillate for measurement of frequency. Based on measurement result, a metal such as silver is deposited on the oscillating electrode 2b of the crystal oscillating element 2 from above, thereby actually weighting the oscillating electrode 2b to adjust the oscillating frequency to a specified value.

Subsequently in Step #4, the frequency of the crystal oscillating element 2 is stabilized. Specifically, the entire main body 1 mounted with the crystal oscillating element 2 is heated at temperatures of 200° C. to 300° C. This heating is generally referred to as "heat aging". This heat aging stabilizes the deposit formed on the oscillating electrode 2b for the frequency adjustment and causes impurities such as solvent contained in the conductive paste to volatilize.

Subsequently in Step #5, the metal cover 6 is sealed. Specifically, a space defined by the main body 1, the seam member 36, and the metal cover 6 is kept at a specified atmosphere. The metal cover 6 is placed on the seam member 36, and is seam-welded to the seam member 36 by moving a roller electrode (not shown) for seam-welding around the metal cover 6 while applying a current.

Subsequently in Step #6, the electronic devices 4, 5 -are mounted. Specifically, conductive resin paste containing silver powder or the like is applied to the electrode portions 33, 33, and cured after the electronic devices 4, 5 are placed thereon. This step can be omitted if the use of the electronic devices 4, 5 are not necessary.

Subsequently in Step #7, the IC chip 3 is mounted. Specifically, the IC chip 3 having gold bumps is positioned and placed such that the gold bumps come into contact with the IC electrode pads 32, 32 on the ceiling surface of the cavity 10 of the main body 1, and then the IC electrode pads 32, 32 and the gold bumps are fused by applying ultrasonic waves or the like to the IC chip 3. Alternatively, it may be appreciated to make the IC chip 3 in contact with the ceiling surface of the cavity 10 by eye-attach, and bond it to the IC electrode pads 32, 32 by gold bonding wire. By mounting the IC chip 3, the monitor electrodes 34, 35 are concealed by the IC chip 3 when the main body 1 is viewed from below. In the case of connection using the gold bumps, the monitor electrodes 34, 35 and the IC chip 3 are not short-circuited since a gap corresponding to the height of the bumps is defined between the ceiling surface of the cavity 10 and the IC chip 3.

Subsequently in Step #8, the IC chip 3 is covered by resin or the like. Specifically, the IC chip 3 and, if necessary, the electronic devices 4, 5 arranged in the cavity 10 are entirely covered by filling and curing a resin made of an epoxy resin or silicone resin, which sets upon being exposed to heat or ultraviolet, by a specified curing method. More specifically, the IC chip 3 and the electronic devices 4, 5 placed in the cavity 10 are completely covered in their entirety by a resin generally called an underfill, which is then cured to form a resin layer 7a. Subsequently, the epoxy resin having an excellent resistance to humidity is filled and cured on the resin layer 7a to form a resin layer 7b. In other words, the filled resin 7 has a laminated structure.

In Step #9, subsequently, the temperature compensation data for flattening the temperature-frequency variation characteristic of the crystal oscillating element 2, which is determined in advance by the frequency adjustment process in order to cause the temperature compensating crystal oscillator to perform a predetermined operation over a wide temperature range including the normal temperature is inputted in the memory of the IC chip 3 using the IC control terminal electrodes 15 to 18.

If necessary, the compensation operation may be checked based on the written compensation data, and corrected compensation data may be written again if the checked operation is unsatisfactory.

This temperature compensation is, for example, a correction of a deviation of the oscillating frequency of the crystal oscillating element 2 at a specific temperature by adjustment of the capacity of the varicap diode. The temperature compensation data is data for properly setting the capacity of the varicap diode which corrects the frequency deviation based on the ambient temperature detected by the temperature sensor. Therefore, the temperature-frequency variation characteristic of the oscillation output of the crystal oscillator can be flattened over a wide temperature range including normal temperature.

In the crystal oscillator manufactured by the above flow, the monitor electrodes 34, 35 for measuring the temperature-frequency variation characteristics of the crystal oscillating element 2 in its mounted state are formed on the ceiling surface of the cavity 10. Thus, the frequency of the oscillating element 2 can be measured from below of the main body 1 using the monitor electrodes 34, 35 which are exposed to the outside before the IC chip 3 is mounted, and deposition can be performed to adjust the frequency of the crystal oscillating element 2 from the above of the main body 1.

Further, the monitor electrodes 34, 35 are finally covered by the IC chip 3. Generally, the IC chip 3 is made of silicone, and serves as a ground potential. In other words, a structure at the ground potential is present outside the monitor electrodes 34, 35. Accordingly, when the crystal oscillator is connected with a specified wiring on a printed circuit board, unnecessary stray capacity will not generate between the wirings, particularly those passing below the crystal oscillator, of the printed circuit board and the monitor electrodes 34, 35. This ensures a very stable operation of the crystal oscillating element 2 free from a variation in the load capacity of the crystal oscillating element.

Further, since the heat aging process for stabilizing the frequency of the crystal oscillating element 2 is performed before the IC chip 3 is mounted, the number of heat application to the IC chip 3 can be reduced, and Au—Al eutectic reaction (Kirkendall void) will not occur at the joint portion of the aluminum input/output electrodes of the IC chip 3 and the connecting members (gold bumps or gold wire). In other words, even if annealing is performed only to stabilize the frequency of the crystal oscillating element 2, the malfunction of the IC chip 3 and the defective connection will not occur at all.

As described above, in this embodiment, the monitor electrodes 34, 35 for measuring the frequency of the crystal oscillating element 2 are exposed at the principle surface (the ceiling surface of the cavity 10) opposite to the top surface of the main body 1 where the crystal oscillating element 2 is arranged. Accordingly, the frequency of the crystal oscillating element 2 can be very easily measured and adjusted.

Further, the crystal oscillating element 2 and IC chip 3 are separately arranged on the top and bottom sides of the main body 1. The process for stabilizing the frequency of the crystal oscillating element 2 (annealing process) can be performed in the state where the IC chip 3 is mounted in the main body 1. Thus, an occurrence of malfunction and defective connection of the IC chip 3 due to exposure to heat can be prevented.

Furthermore, a defective product is decided and thrown away after the crystal oscillating element 2 is mounted, but before the IC chip 3 is mounted. Thus, the inventive method enables less expensive manufacturing of crystal oscillators without necessitating unnecessary waste of IC chips.

Therefore, the oscillation characteristics of the inventive crystal oscillators do not change even after they are mounted on the surface of printed circuit boards.

Furthermore, in the crystal oscillator, the external terminal electrodes 11 to 14 are arranged at the four corners of the bottom surface of the main body 1. The areas of the bottom surface of the main body 1 which separates the opposite external terminal electrodes 11 to 14 are effectively used as areas for the bulging space portions 10a to 10d of the cavity 10. Thus, the dead space in the bottom surface of the main body 1 can be minimized while ensuring the sufficiently large external terminal electrodes 11 to 14. Therefore, this surface-mount type crystal oscillator needs a very small space for mount over a printed circuit board.

The external terminal electrodes 11 to 14 include the substantially rectangular horizontal portions 11a to 14a and the vertical portions 11b to 14b extending along the thickness direction at the corners of the main body 1, respectively. The vertical portions 11b to 14b are adapted to connect the external terminal electrodes 11 to 14 with the IC chip 3 and the electronic devices 4, 5, and act as conductive paths which relatively easily establish the connection. Further, molten solder creeps up from the horizontal portions 11a to 14a to the vertical portions 11b to 14b when the crystal oscillator is soldered to the printed circuit board. The vertical portions 11b to 14b also act to confirm the bonded state of the crystal oscillator by the creeping-up of the solder.

Particularly, by forming the vertical portions 11b to 14b in the notches in the form of a 90° sector at the corners of the main body 1, a thermal shock stress created during the soldering can be dispersed, thereby improving the shock resistance.

The external terminal electrodes 11 to 14 can be arranged at the corners of the bottom surface of the main body 1 because the IC control terminal electrodes 15 to 18, which are used to write temperature compensation data in the IC chip 3, but not used when the crystal oscillator is bonded to the printed circuit board, are arranged on the opposite longer sides of the main body 1. If the IC control terminal electrodes 15 to 18 are formed near and parallel to the bottom surface of the main body 1, some measure needs to be taken against the contact with the solder while the crystal oscillator is being soldered to the printed circuit board. If such a measure is taken, it becomes difficult to effectively utilize the bottom surface of the main body 1 only for the cavity 10 and the external terminal electrodes 11 to 14.

Although the cavity 10 has a substantially cross-like shape in the foregoing embodiment, two electronic devices 4, 5 may be arranged in one bulging space portion in the case where the number of IC chip 3 and electronic devices 4, 5 for forming the control circuit increases.

The external terminal electrode 14 which serves as VCON terminal may be omitted depending on the operation of the control circuit. In such a case, it may be used as a dummy electrode to maintain the strength against soldering. Even a surface-mount type crystal oscillator in which the external terminal electrode 14 is omitted and the external terminal electrodes 11 to 13 are formed at three corners of the bottom surface of the rectangular main body 1 is also embraced by the scope of the invention.

In the case where an electronic device 5 or capacitor is mounted on a printed circuit board and an IC chip 3 and an electronic device 4 are arranged in the cavity 10 of the main body 1, the cavity 10 may be substantially T-shaped as a whole by omitting the bulging space portion 10a thereof formed in the bottom surface area between the external terminal electrodes 11 and 14.

Figure 8A:
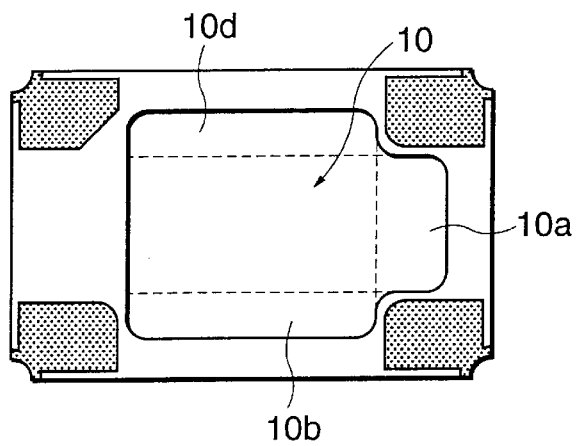
FIGS. 8A, 8B, and 8C are diagrams showing modifications of a bulging space portion of a cavity of the crystal oscillator of FIG. 1.
Figure 8B:
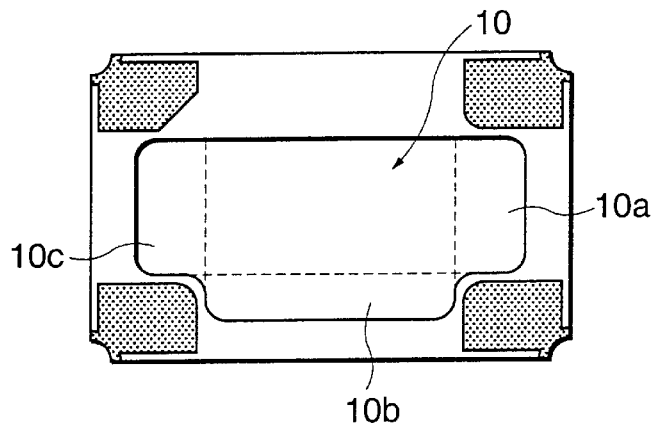
Figure 8C:
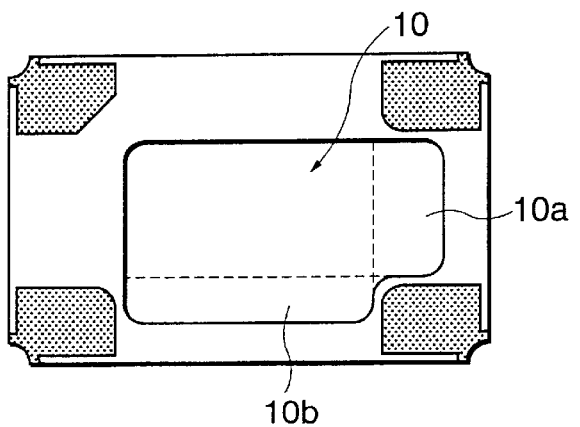

FIGS. 8A to 8C are diagrams showing other shapes of the cavity 10, wherein FIG. 8A shows the cavity 10 in which the bulging space portion 10c is omitted, FIG. 8B shows the cavity 10 in which the bulging space portion 10d is omitted and FIG. 8C shows the cavity 10 in which the bulging space portions 10c, 10d are omitted. The cavity 10 can be said to be T-shaped in FIGS. 8A and 8B.

Further, the external terminal electrodes 11 to 14 may have a substantially triangular shape having an apex at each corner of the bottom surface of the main body 1. The cavity 10 may have a rhombic shape having vertices at positions between the opposite two external terminal electrodes 11 to 14 or a polygonal shape such as octagon obtained by cutting off corners of the rhombic shape.

As described above, the external terminal electrodes 11 to 14 need neither be changed in shape nor be reduced in size in deciding the shape of the cavity 10. Thus, the strength of soldering to the printed circuit board can be maintained. Further, by mounting any one of the IC chip 3 and the electronic devices 4, 5 in a bulging space portion 10a to 10d extending in an intermediate area between the opposite two external terminal electrodes, the dead space of the cavity 10 can be minimized and the IC chip 3 and the electronic devices 4, 5 for securing a stable oscillation can be simultaneously mounted in the cavity 10. Therefore, there can be obtained a small-sized surface-mount type crystal oscillator of high performance, which enables a reduction in the number of external circuits formed on a printed circuit board.

Next, modifications of the upper construction of the crystal oscillator will be described with reference to FIGS. 9 to 13.

Figure 9:
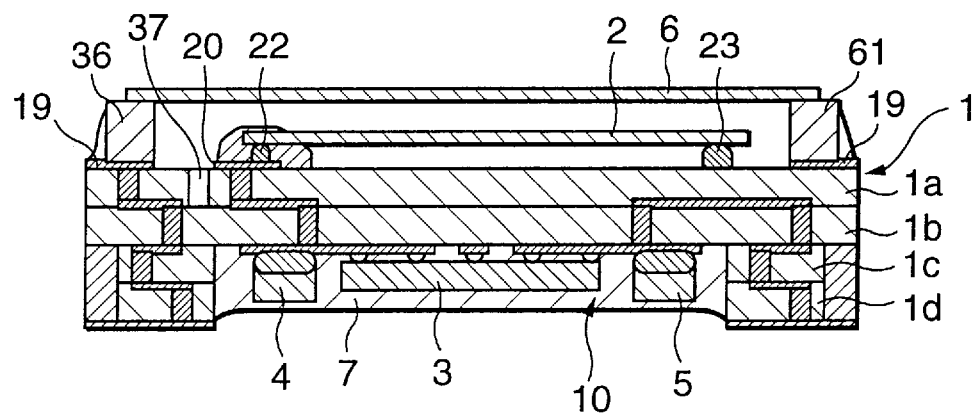
FIG. 9 is a sectional view of another surface-mount type crystal oscillator embodying the invention.
Figure 10:
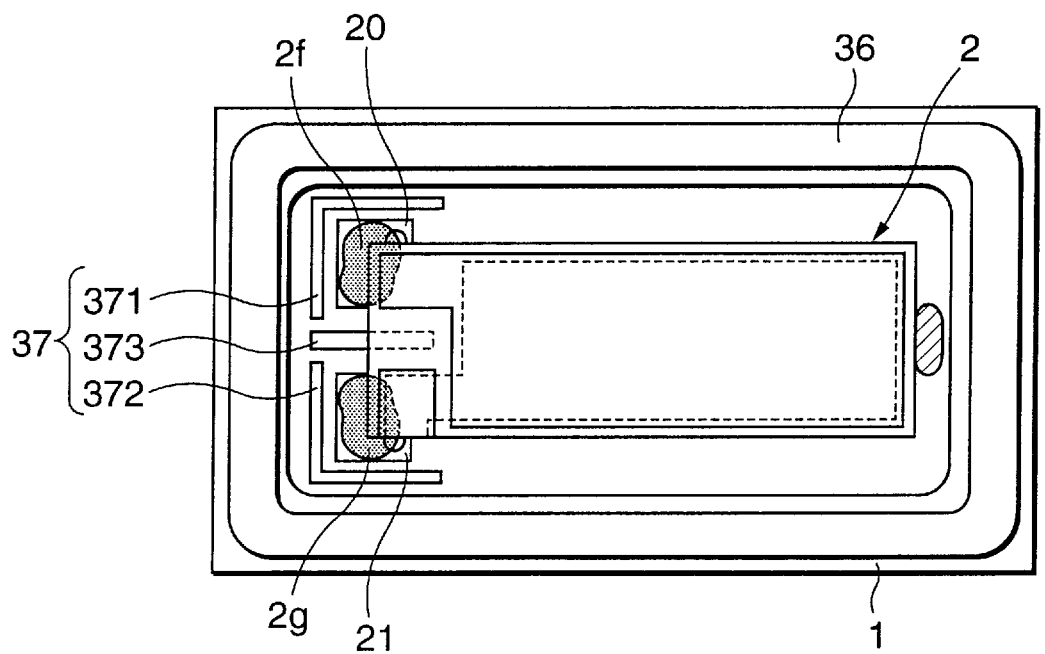
FIG. 10 is a top view of the crystal oscillator of FIG. 9, a cover being removed.

In FIGS. 9 and 10, a ceramic insulating layer 1a is formed with a groove unit 37 which penetrates the ceramic insulating layer 1a and reaches the top surface of the ceramic insulating layer 1b. As shown in FIG. 10, the groove unit 37 is comprised of an L-shaped groove 371 extending in proximity to and along the left and rear sides of the electrode pad 20, an L-shaped groove 372 extending in proximity to and along the left and front sides of the electrode pad 21, and an I-shaped groove 373 which crosses between the electrode pads 20 and 21 to partition them. The respective grooves 371 to 373 are distanced from the outer ends of the electrode pads 20, 21 by at least 0.1 mm; and the width thereof is at least 0.1 mm; and the depth (corresponding to the thickness of the ceramic insulating layer 1a) thereof is, for example, 0.15 mm. Further, the two L-shaped grooves 371, 372 are not connected with the I-shaped groove 373.

The crystal oscillating element 2 is coupled to the electrode pads 20, 21 by applying conductive resin paste containing silver powder, epoxy resin and phenol resin, or creamy solder as conductive resin adhesives 2f, 2g to the electrode pads 20, 21, and placing the crystal oscillating element 2 thereon. Even if the conductive resin paste or the creamy solder comes out of the electrode pads 20, 21, superfluous conductive resin paste or creamy solder enters the grooves 371 to 373 of the groove unit 37.

Accordingly, even if the sealing conductive layer 19 and the electrode pads 20, 21 are formed on the top surface of the main body 1 in order to make the crystal oscillator thinner, superfluous conductive resin adhesives 2f, 2g (solder or conductive resin adhesive) applied to the electrode pads 20, 21 to couple the crystal oscillating element 2 to the electrode pads 20, 21 is taken up by the groove unit 37 formed between the sealing conductive layer 19 and the electrode pads 20, 21 which are located close to each other. As a result, there is no likelihood that the electrode pads 20, 21 and the sealing conductive layer 19 are short-circuited. This is effective for the crystal oscillator in which the electrode pads 20, 21 and the sealing conductive layer 19 are located close to each other as a result of making its shape in top view smaller for the miniaturization of the crystal oscillating element 2. Since the groove unit 37 formed in the top surface of the main body 1 can be formed by processing only the green sheet of the ceramic insulating layer 1a on the top surface, this process can be very easily performed. Further, in a mode where the groove unit 37 is formed near the sides of the electrode pads except the sides toward the center, an area enclosed by the groove unit 37, i.e., an area where the electrode pads 20, 21 are formed is stable without being deformed even in the state of a green sheet. As a result, the electrode pads 20, 21 can be stably formed in this area, thereby maintaining the evenness of the top surface, spacing the crystal oscillating element 2 and the top surface of the main body 1 by a specified distance, and enabling a stable operation of the crystal oscillating element 2. Therefore, there can be obtained a thin small-sized crystal oscillator having a stably operative crystal oscillating element 2.

In FIG. 10, the groove unit 37 surrounds the three sides of the two electrode pads 20, 21 by the three grooves 371 to 373. However, if the two electrode pads 20, 21 are sufficiently distanced from each other, the I-shaped groove 373 can be omitted.

Figure 11:
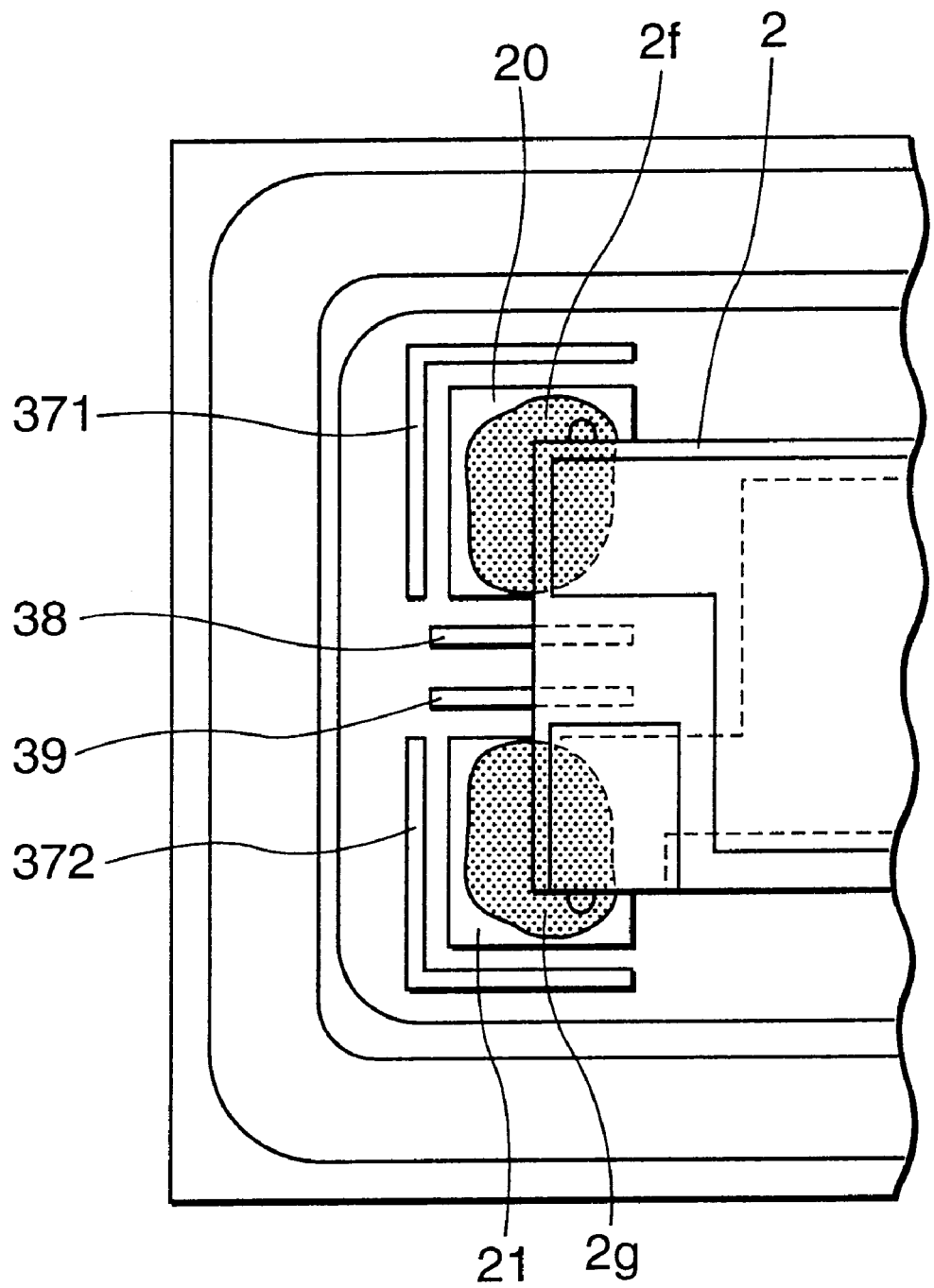
FIG. 11 is a partial top view showing a modification of an upper construction of the crystal oscillator of FIG. 9.

Conversely, if the spacing between the two electrode pads 20, 21 is such as to ensure a sufficient rigidity of the green sheet during the manufacturing process, two I-shaped grooves 38, 39 may be formed therebetween as shown in FIG. 11, so that one electrode pad 20 has its three side surrounded by the L-shaped groove 371 and the I-shaped groove 38 and the other electrode pad 21 has its three sides surrounded by the L-shaped groove 372 and the I-shaped groove 39.

Figure 12:
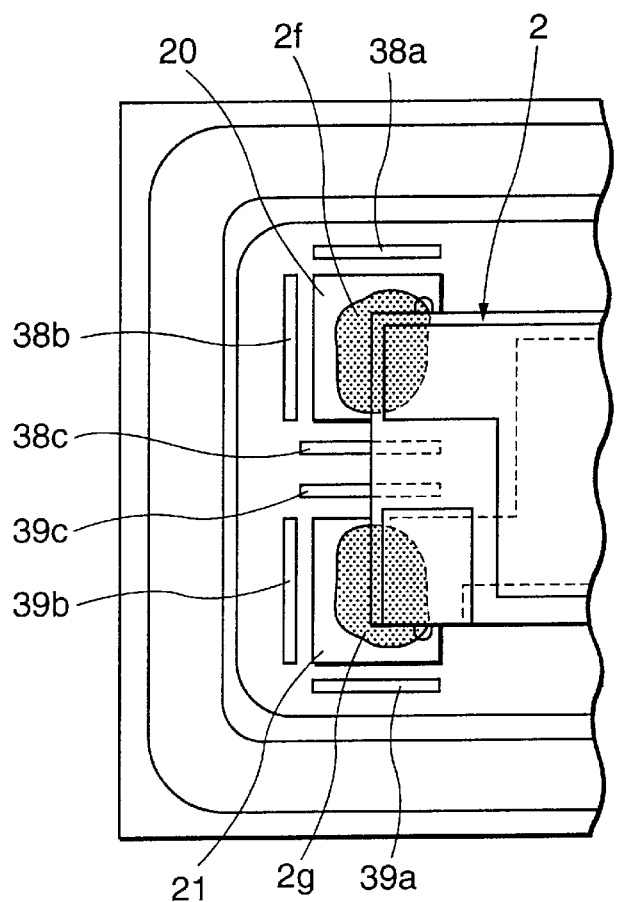
FIG. 12 is a partial top view showing another modification of the upper construction of the crystal oscillator of FIG. 9.

Further, as shown in FIG. 12, two I-shaped grooves may be formed instead of the L-shaped groove. Then, one electrode pad 20 has its three side surrounded by the respective I-shaped grooves 38a, 38b, 38c and the other electrode pad 21 has its three sides surrounded by the I-shaped grooves 39a, 39b, 39c. The embodiments of FIGS. 11 and 12 can attain the same effects as the embodiment of FIG. 10.

Although the electrode pads 20, 21 are rectangular in the aforementioned embodiment, they may be circular. In such a case, though the electrode pads do not have three sides, the groove unit 37 may be so formed as to communicate at the center side (between the electrode pads 20, 21) where it is not in contact with the sealing conductive layer 19 and to extend toward an area in proximity to the sealing conductive layer 19. At this time, the groove is substantially C-shaped as a whole, but is preferably discontinuous in view of the rigidity of the green sheet in the area where the electrode pads 20, 21 are formed.

Figure 13:
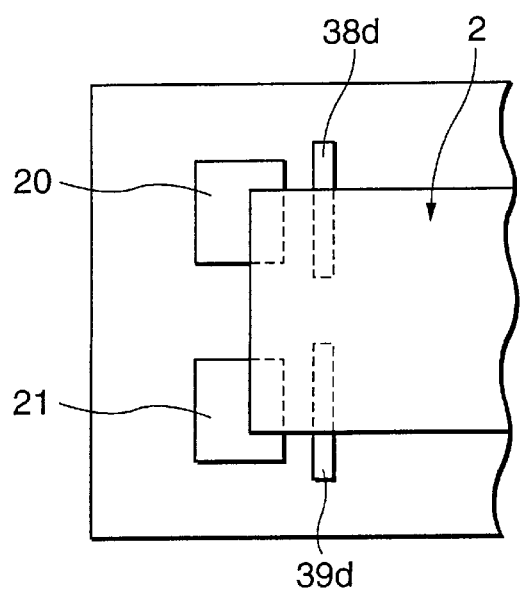
FIG. 13 is a partial top view showing still another modification of the upper construction of the crystal oscillator of FIG. 9.

In FIG. 13, grooves 38d, 39d are formed at the right side of the electrode pads 20, 21, i.e., at the side toward the center of the space for accommodating the crystal oscillating element 2. This construction can take up the superfluous conductive resin adhesives 2f, 2g (solder or conductive resin adhesive) applied to the electrode pads 20, 21 and spread toward the crystal oscillating element 2. Accordingly, an undesired event where superfluous conductive resin adhesive 2f, 2g having spread to the crystal oscillating element 2 comes into contact with the crystal oscillating element 2 to thereby change the oscillation characteristics of the crystal oscillating element 2 can be prevented from occurring. The grooves 38d, 39d may be singly formed or may be formed together with the grooves 37, 38, 39.

Figure 14:
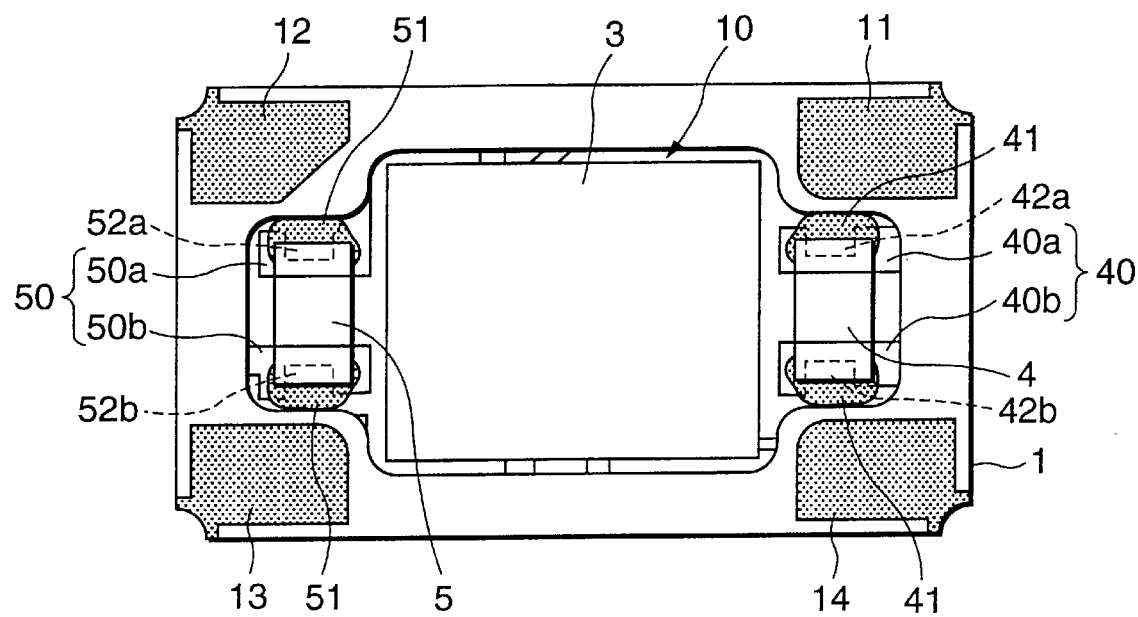
FIG. 14 is a bottom view showing a modified construction of mounting electronic devices in the crystal oscillator of FIG. 1 or 9.
Figure 15:
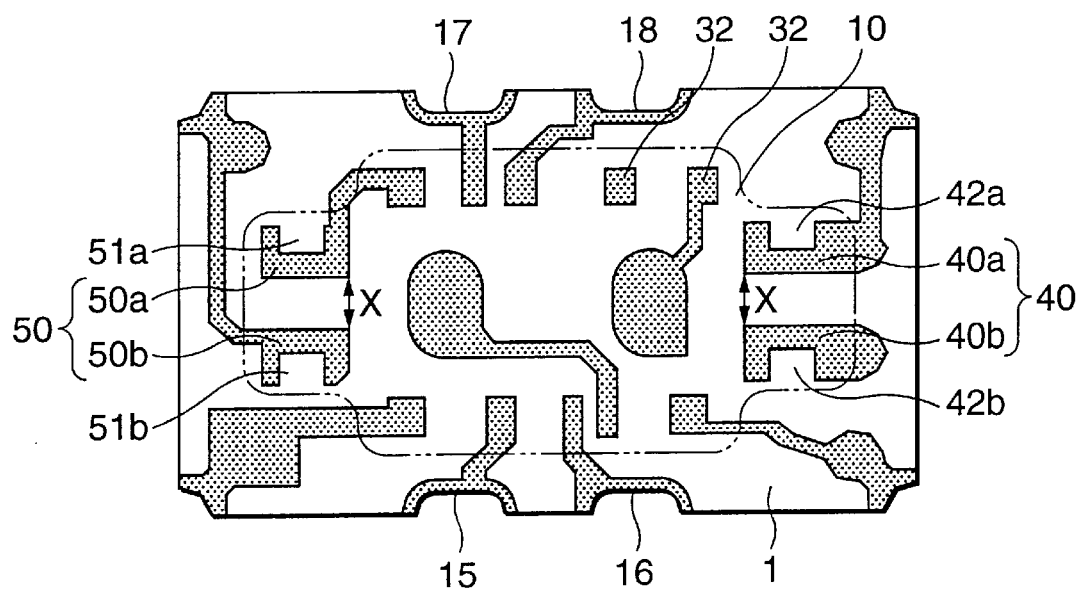
FIG. 15 is a schematic diagram showing a modification of internal wiring conductors of the crystal oscillator of FIG. 1 or 9.

Next, FIG. 14 is a bottom view showing another construction for mounting electronic devices in the inventive crystal oscillator without resin, and FIG. 15 is a schematic top view showing other wiring conductors on the ceiling surface of the cavity of the inventive crystal oscillator.

The construction of FIGS. 14 and 15 differs from that of FIG. 6 in that electrode portions 40, 50 having notches are provided instead of the electrode pads 33 having a generally rectangular shape on the ceiling surface of the cavity 10. Specifically, the device electrode portion 40 is comprised of a pair of electrodes 40a, 40b and the device electrode portion 50 is comprised of a pair of electrodes 50a, 50b.

As shown in FIG. 14, the electronic devices 4, 5 which could be capacitors or the like are respectively coupled to the device electrode portion 40 comprised of the pair of electrodes 40a, 40b and the device electrode portion 50 comprised of the pair of electrodes 50a, 50b using conductive resin adhesives 41, 51 containing silver powder. The conductive resin adhesives 41, 51 are made of conductive resin paste containing, for example, silver powder, epoxy resin and phenol resin, and are cured by heating at about 150° C. after being applied to the electrodes 40a, 40b, 50a, 50b to couple the electronic devices 4, 5 to the electrode portion 40, 50.

In this modification, notches 42a, 42b and 52a, 52b extending inwardly of the electrodes 40a, 40b and 50a, 50b are formed at the outer sides of the pair of electrodes 40a, 40b of the device electrode portion 40 and the pair of the electrodes 50a, 50b of the device electrode portion 50 as shown in FIGS. 14 and 15. Specifically, the pair of electrodes 40a, 40b on which, for example, the electronic device 4 is placed are spaced apart by a distance x in view of a spacing between a pair of external electrodes of the electronic device 4. It should be noted that sides of the electrodes 40a, 40b opposite to each other are referred to as inner sides and the sides thereof opposite from the inner sides are referred to as outer sides in FIG. 15.

The electrodes 40a, 40b each are generally rectangular as a whole. The substantially rectangular notches 42a, 42b are formed in the outer side of the electrodes 40a, 40b. A width of the rectangular notch 42a, 42b is shorter than the outer side of the electrode 40a, 40b and a depth thereof is shorter than the length of the electrodes 40a, 40b between the inner and outer sides. A center line of the outer side of the electrodes 40a, 40b and a center line of the notch 42a, 42b normal to its widthwise direction substantially coincide with each other. The electronic devices 4, 5 are mounted on the electrodes 40a, 40b and 50a, 50b by applying and curing the conductive resin paste as the conductive resin adhesive 41, 51.

By the above construction, even if the conductive resin paste applied to the electrodes 40a, 40b spreads when the electronic device 4 is placed thereon, the external terminal electrodes of the electronic device 4 will not be short-circuited because the conductive resin paste moves toward the notches 42a, 42b.

The conductive resin paste moves toward the notches 42a, 42b because the outer surface of the electrodes 40a, 40b are gold-plated and the ceiling surface of the cavity 10 exposed through the notches 42a, 42b are of ceramic material. Since the ceiling surface of the cavity 10 is more coarse than the outer surfaces of the electrodes 40a, 40b, the conductive resin paste is more likely to flow toward the notches 42a, 42b. In this way, the spreading direction of the conductive resin paste applied to the outer surfaces of the electrodes 40a, 40b can be controlled.

The construction for mounting the electronic device 4 on the electrodes 40a, 40b formed as above using the conductive resin adhesive 41 is particularly useful in the case that it is difficult to efficiently apply solder, i.e., in the case that solder cannot be supplied by printing technique as with the ceiling surface of the cavity 10, in the case that it is difficult to clean the cavity 10, or in the case that the electronic devices 4, 5 are arranged beside the IC chip 3 or like device which is affected by the application of heat at about 200° C. Since the flowing direction of the conductive resin adhesive can be controlled, an efficient arrangement of the IC chip 3 and the electronic devices 4, 5 in the cavity 10 free from short-circuiting caused by the conductive resin adhesive can be designed.

Next, referring to FIGS. 16A to 16H and 17A to 17H, the bonding of the electronic device 4 is described with respect to the electrodes 40a, 40b having notches 42a, 42b and electrodes 10a, 10b having no notches. FIGS. 16A to 16H relate to the electrodes 40a, 40b, and FIGS. 16A, 16C, 16E and 16G are partial top views while FIGS. 16B, 16D, 16F and 16H are partial side views. FIGS. 17A to 17H relate to the electrodes 10a, 10b, and FIGS. 17A, 17C, 17E and 17G are partial top views while FIGS. 17B, 17D, 17F and 17H are partial side views.

Figure 16A:
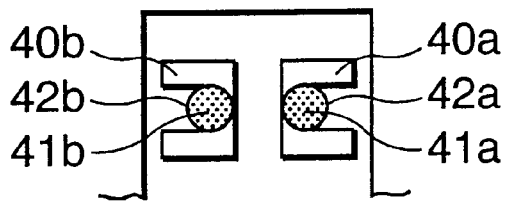
Figure 16B:
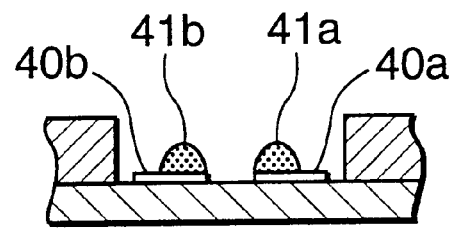
Figure 16C:
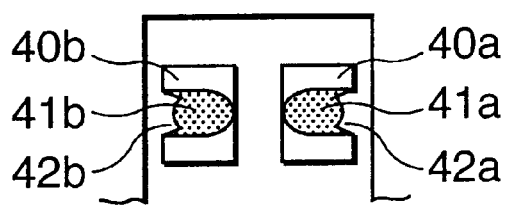
Figure 16D:
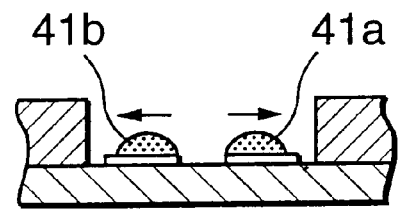

In FIGS. 16A and 16B, the conductive resin pastes 41a, 41b are supplied onto the electrodes 40a, 40b. For example, a supplying method using a dispenser is used here. In FIGS.

16C and 16D, the supplied conductive resin pastes 41*a*, 41*b* flow toward the outer sides along the notches 42*a*, 42*b*. This occurs because the ceiling surface of the cavity 10 is more coarse than the outer surfaces (gold-plated) of the electrodes 40*a*, 40*b*.

Figure 16E:
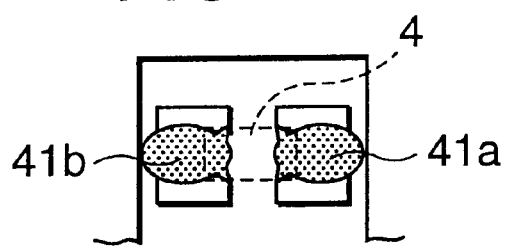
Figure 16F:
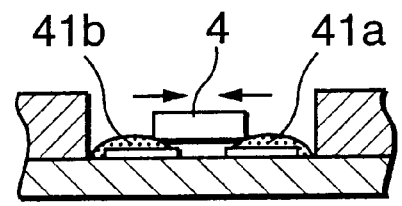
Figure 16G:
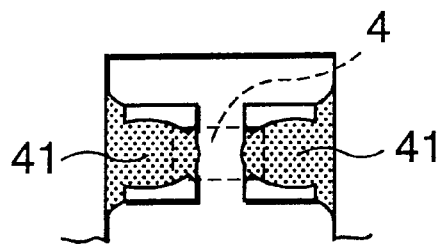
Figure 16H:
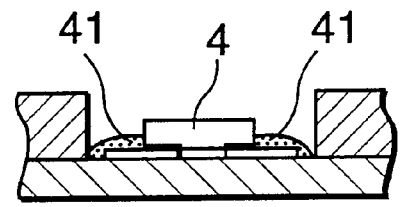

Subsequently, the electronic device 4 (shown by the dotted line in FIG. 16E) is placed on the electrodes 40*a*, 40*b* as shown in FIGS. 16E and 16F. The conductive resin pastes 41*a*, 41*b* partially flow toward the center by being pushed down by the terminal electrodes of the electronic device 4. However, since the conductive resin pastes 41*a*, 41*b* are simultaneously tempted to flow toward the outer sides, they flow toward the center only in small quantity. In this state, the conductive resin pastes 41*a*, 41*b* are heated to cure at a temperature of, e.g., 150° C., thereby becoming the conductive resin adhesives 41. Thus, the conductive resin adhesives 41 between the terminal electrodes of the electronic device 4 are held sufficiently distanced, with the result that the electronic device 4 can be mounted while effectively suppressing the likelihood that the conductive resin adhesives 41 are short-circuited.

Figure 17A:
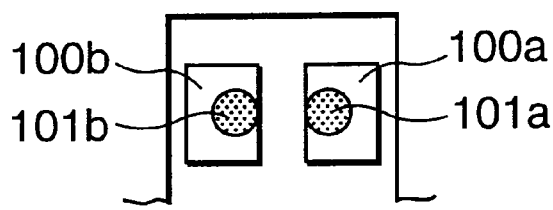
Figure 17B:
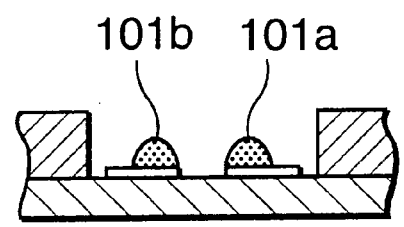

Contrary to this, the mounting mechanism of the electronic device 4 on the rectangular electrodes 100 is shown in FIGS. 17A to 17H. In FIGS. 17A, 17B, conductive resin pastes 101*a*, 101*b* are supplied onto the electrodes 100*a*, 100*b*.

Figure 17C:
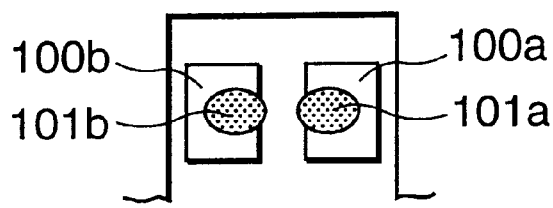
Figure 17D:
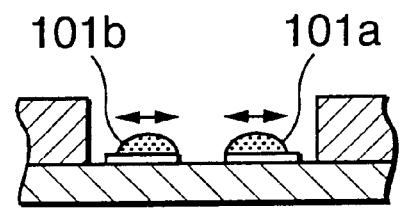

In FIGS. 17C, 17D, the supplied conductive resin pastes 101*a*, 101*b* spread in all the directions.

Figure 17E:
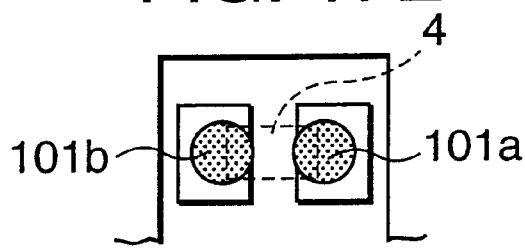
Figure 17F:
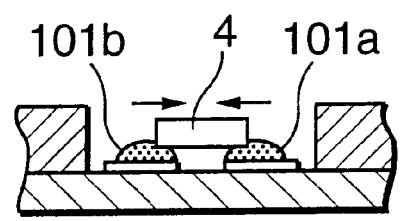
Figure 17G:
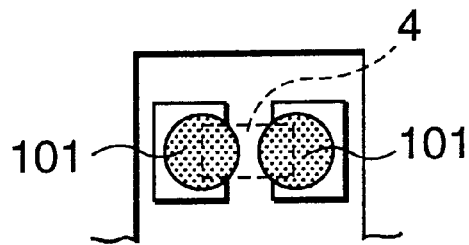
Figure 17H:
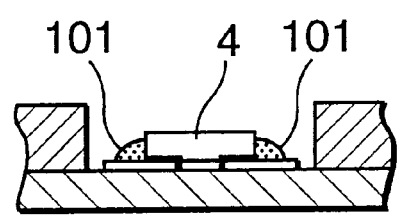

Subsequently, the electronic device 4 is placed on the conductive resin pastes 101*a*,101*b* as shown in FIGS. 17E and 17F. In this state, the conductive resin pastes 101*a*, 101*b* flow toward the center along the terminal electrodes of the electronic device 4. Since the conductive resin pastes 101*a*, 101*b* are not tempted to flow toward the outer sides at this time, they come out of the sides of the electrodes 100*a*, 100*b* toward the center. In FIGS. 17G, 17H, the conductive resin pastes 101*a*, 101*b* are heated to cure, thereby becoming conductive resin adhesives 101, 101. In this case, short-circuiting is likely to occur between the terminal electrodes of the electronic device 4.

As described above, since the notches 42*a*, 42*b* formed in the electrodes 40*a*, 40*b* determine the flowing directions of the conductive resin pastes 41*a*, 41*b*, short-circuiting between the electrodes 40*a* and 40*b* can be effectively prevented.

In this modification, although the notches 42*a*, 42*b* are formed at the outer sides of the electrodes 40*a*, 40*b* opposite from the inner sides thereof which face each other, they may be formed at the sides other than the outer sides. Since the flowing directions of the conductive resin pastes 41*a*, 41*b* are controlled by forming the notches 42*a*, 42*b*, notches may be formed any sides except the inner sides depending on the arrangement of an adjacent other electronic device such as the IC chip 3.

Figure 18:
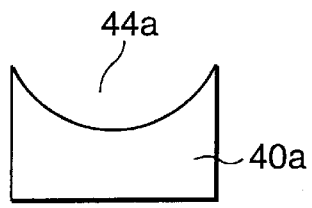
FIG. 18 is a top view showing a modified electrodes for an electronic device to be mounted on the crystal oscillator of FIG. 1 or 9.
Figure 18:
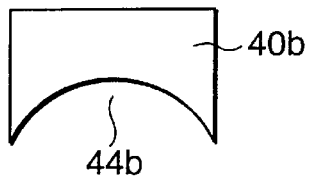
Figure 19:
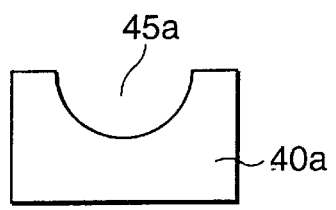
FIG. 19 is a top view showing another modified electrodes for an electronic device to be mounted on the crystal oscillator FIG. 1 or 9.
Figure 19:
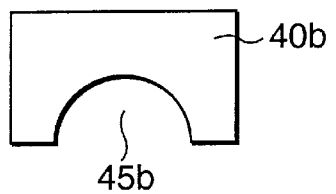
Figure 20:
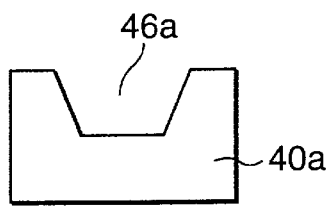
FIG. 20 is a top view showing still another modified electrodes for an electronic device to be mounted on the crystal oscillator FIG. 1 or 9.
Figure 20:
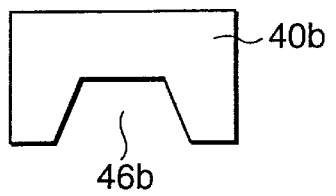

The electrodes 40*a*, 40*b* may take such configurations as shown in FIGS. 18 to 20 in order to tempt the supplied conductive resin paste to flow toward the outer sides.

FIG. 18 shows a modified electrodes 40*a*, 40*b* formed with notches 44*a*, 44*b* having a substantially semicircular cross section of a diameter substantially equal to the length of the outer sides of the electrodes 40*a*, 40*b*.

FIG. 19 shows a modified electrodes 40*a*, 40*b* formed with notches 45*a*, 45*b* having a substantially semicircular cross section of a diameter shorter than the outer sides of the electrodes 40*a*, 40*b*. This modification can increase an area of each electrodes 40*a*, 40*b* as compared with those of FIG. 18.

FIG. 20 shows a modified electrodes 40*a*, 40*b* formed with trapezoidal notches 46*a*, 46*b* at their outer sides. Although unillustrated, the shape of the notches may be elliptical or polygonal.

It should be noted that the outer sides may be any of the three sides of the electrodes 40*a*, 40*b* except the inner sides thereof which face each other. Further, the shape of the electrodes 40*a*, 40*b* are not limited to rectangular.

Although the above description is made with reference to the electrodes 40*a*, 40*b*, further, it should be noted that the electrodes 50*a*, 50*b* have the same advantageous effects and can be modified as the electrodes 40*a*, 40*b*.

Since the flowing directions of the conductive resin paste 41*a*, 41*b*, 51*a*, 51*b* can be controlled when the chip-shaped electronic devices 4, 5 are mounted in the cavity 10 of the main body 1 using the conductive resin adhesive 41, 51, short-circuiting between the pair of electrodes 4, 5 can be effectively prevented, bonding strength can be improved, and the spacing distance between adjacent electronic devices 3, 4, 5 can be set short.

Figure 21:
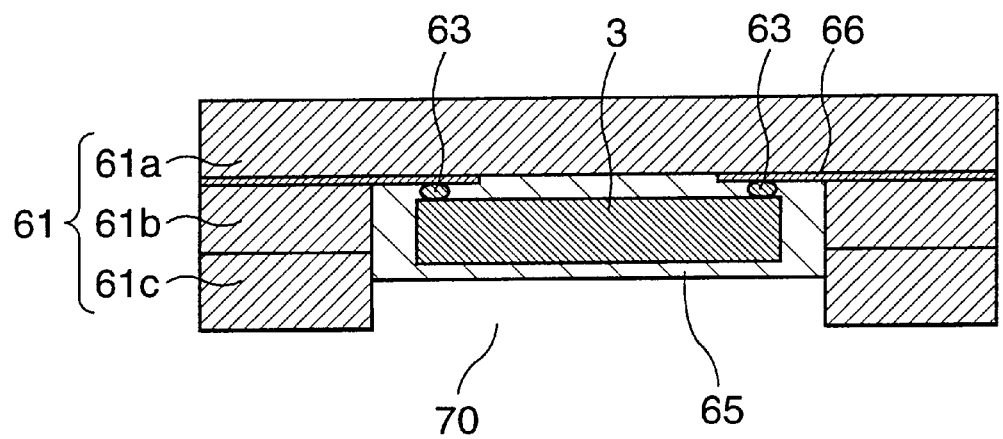
FIG. 21 is a sectional view of still another surface-mount type crystal oscillator embodying the invention, showing an inventive resin filling construction.

FIG. 21 shows a sectional view of another inventive crystal oscillator. In FIG. 21 are shown an IC chip 3 and a main body 61 comprised of three ceramic insulating layers 61*a*, 61*b*, 61*c* (corresponding to the ceramic insulating layers 1*b*, 1*c*, 1*d*)stacked one on top of another and each having wiring conductors. A space defined by the inner wall surfaces of the hollow insulating layers 61*b*, 61*c* and the plate-shaped insulating layer 61*a* is used as a cavity 70 for accommodating the IC chip 3. It should be noted that description made hereinbelow for this embodiment holds also for the respective crystal oscillators described above.

IC electrode pads 66 for the IC chip 3 are formed with gold bumps 63 in advance. The IC chip 3 is electrically connected with the electrode pads 66 formed on the ceiling surface of the cavity 70 by coupling the bumps 63 to the electrode pads 66 on the insulating layer 61*c* by adhesion using silver paste or ultrasonic fusion. Although being mechanically fixedly attached by this coupling, the IC chip 3 is more strongly attached by filling thermosetting resin 65 in a remaining space of the cavity 70 and curing this resin 65.

Figure 22:
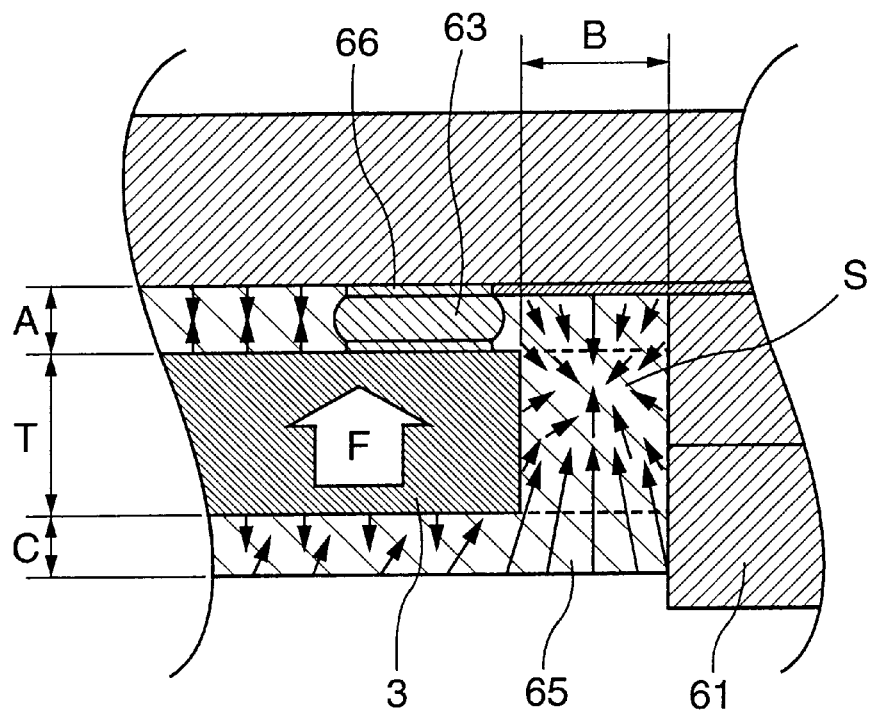
FIG. 22 is a partial enlarged sectional view of the crystal oscillator of FIG. 21, representing stresses acting on an IC chip.
Figure 23:
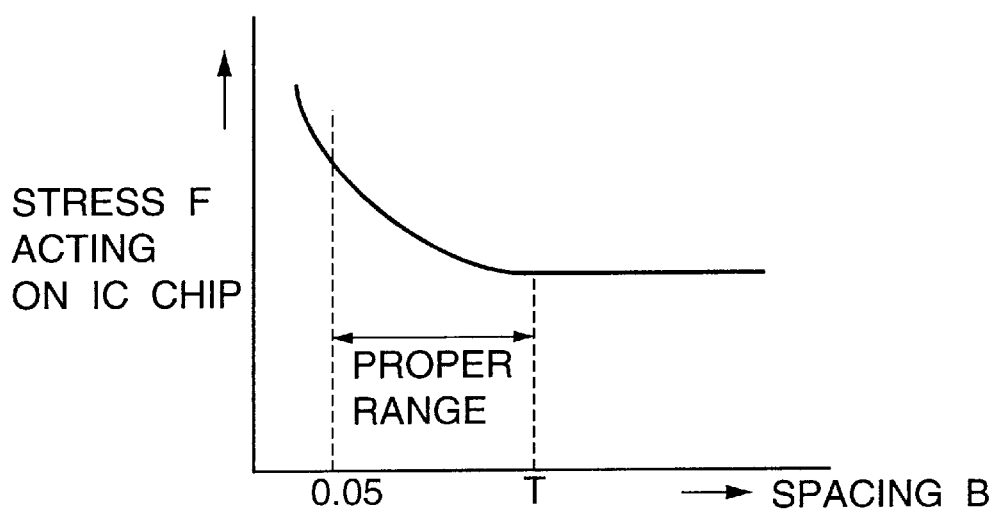
FIG. 23 is a graph showing a relationship between a stress acting on the IC chip and a distance between the IC chip and an inner side surface of the cavity in the crystal oscillator of FIG. 21.

As the resin 65 can be used, for example, a commercially available epoxy resin having a viscosity of 3000 cps, a coefficient of linear expansion of 30 ppm and a coefficient of shrinkage of 1.7%. The resin 65 is filled without leaving any space in such a manner that the surface thereof is located between the upper surface of the IC chip 3 and the opening edge of the cavity 70. After the resin 65 is filled, temperature is immediately increased to a curing temperature. This causes the surface of the resin 65 to harden and shrink and the IC chip 3 is pushed toward the insulating layer 61*a* by a resulting shrinking force. Further, an amount of the resin 65 filled is preferably such that the spacing B between the IC chip 3 and the inner side wall of the cavity 70 is equal to or smaller than the thickness T of the IC chip 3 as shown in FIG. 22. This is based on a relationship between the stress F pushing the IC chip 3 and the spacing B. As shown in FIG. 23, the stress F decreases as the spacing B increases, and becomes constant when the spacing B exceeds the thickness T. This is because the rectangular area S of T×B enclosed by the broken line in FIG. 22 is vertically long when the thickness T is greater than the spacing B, thereby making the coefficient of shrinkage along vertical direction larger. Conversely, if the area S is laterally long when the thickness T is smaller than the spacing B, thereby making the coefficient of shrinkage along horizontal direction larger and weakening the stress F pushing the IC chip 3. The spacing B needs to be at least 0.05 mm. If B<0.05 mm, the IC chip 3 comes into contact with the inner side wall surface of the cavity 70 when being accommodated in the cavity 70, with the result that it cannot be stably accommodated or may be chipped.

Figure 24:
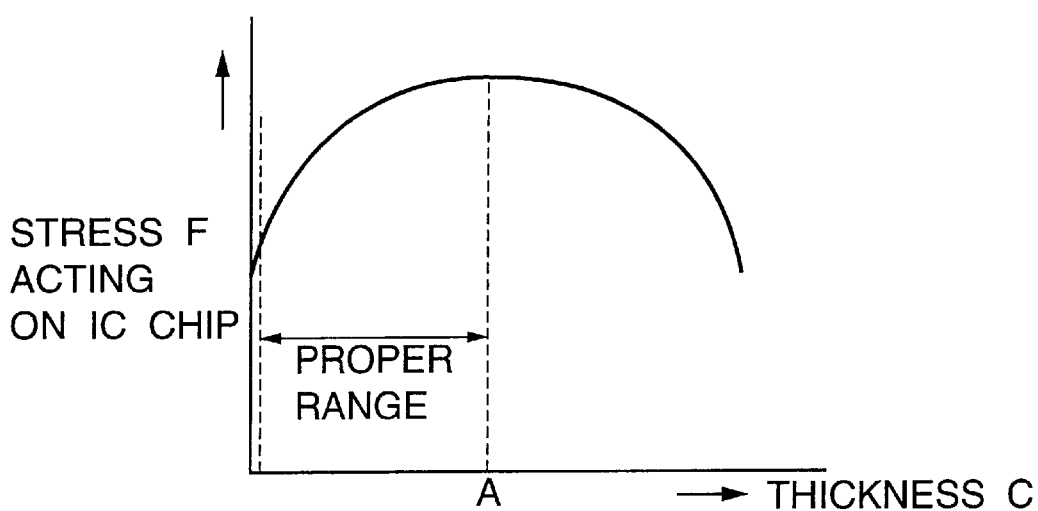
FIG. 24 is a graph showing a relationship between a stress acting on the IC chip and a distance between the IC chip and a ceiling surface of the cavity in the crystal oscillator of FIG. 21.

In FIG. 22, further, the thickness between the surface of the IC chip 3 and the surface of the resin 65 is indicated at C and the spacing Between the IC chip 3 and the ceiling surface of the cavity 70 is indicated at A. The stress F increases as the thickness C increases, and is at maximum when the thickness C is equal to the gap A as shown in FIG. 24. This is because the coefficient of shrinkage of the resin above the IC chip 3 becomes larger than that of the resin below the IC chip 3 if the thickness C is greater than the gap A.

In the cavity 70 may be accommodated circuit devices (electronic devices) such as capacitors in addition to the IC chip 3. For example, if the IC chip 3 is used for temperature compensation of the crystal oscillating element in the crystal oscillator, high frequency noise needs to be cut. It is also necessary to prevent alternating-current components from being added. In such a case, if the capacitor is thinner than the IC chip 3, the resin 65 covers the capacitor at the same time it covers the IC chip 3. Conversely, if the capacitor is thicker than the IC chip 3, it is sufficient to fill the resin 65 to such an extent as to cover the capacitor as long as the resin 65 does project from the opening edge of the cavity 70.

Figure 25:
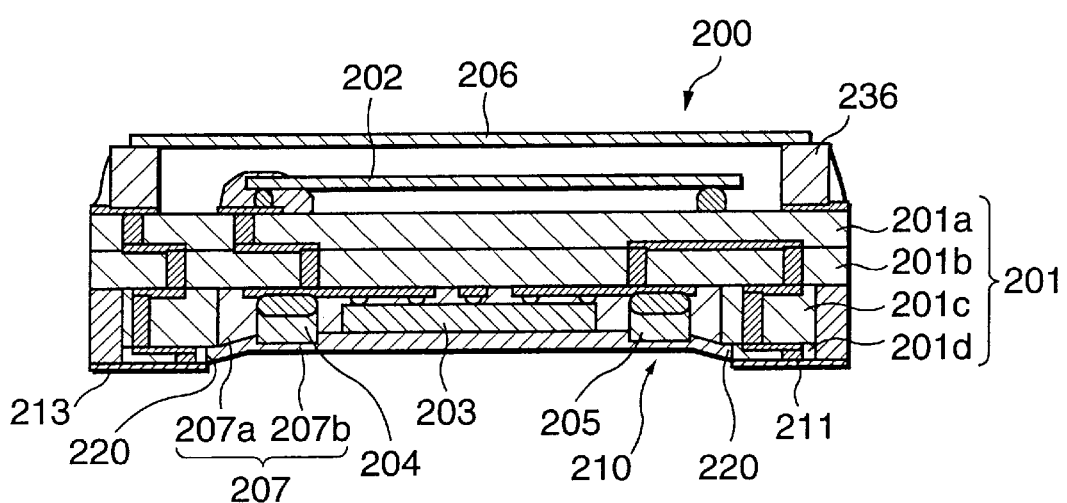
FIG. 25 is a sectional view of yet still another surface-mount type crystal oscillator embodying the invention, showing another inventive resin filling construction.

Next, FIG. 25 is a sectional view of another inventive crystal oscillator filled with resin in its cavity. The construction of the crystal oscillator shown in FIG. 25 differs from the one shown in FIG. 2 mainly in the shape of the cavity, and is substantially identical in other points.

In FIG. 25, a crystal oscillator 200 is mainly comprised of an IC chip 203 to be mounted by a flip chip, a main body 201 made of a multitude of ceramic layers 201a to 201d, two electronic devices 204, 205 such as capacitors, a crystal oscillating element 202, a metal cover 206 and a resin 207. A control circuit for compensating a temperature dependency of the crystal oscillating element 202 is integrated into the IC chip 203. The main body 201 is an integral assembly of two plate-shaped ceramic insulating layers 201a, 201b and two hollow ceramic insulating layers 201c, 201d. A metal seam member 236 is coupled to the upper surface of the insulating layer 201a; the crystal oscillating element 202 is mounted in a space enclosed by the insulating layer 201a and the seam member 236; and this space is hermetically closed by the metal cover 206.

On the other hand, a space defined by the insulating layer 201b on the opposite side and the insulating layers 201c, 201d is a cavity 210. Although the insulating layers 201c, 201d are similar in shape in top view, they differ in thickness: the thickness of the insulating layer 201d is 0.1 mm and fairly smaller than that of the insulating layer 201c, and the opening area of the insulating layer 201d for forming the cavity 210 is larger than that of the insulating layer 201c. Thus, the inner walls of the insulating layer 201c project inwardly due to a difference in the opening, forming a step 220 having a height corresponding to the thickness of the insulating layer 201d. The electronic devices 204, 205 are mounted on the ceiling surface of the cavity 210 in addition to the IC chip 203. The IC chip 203, the electronic devices 204, 205 and the crystal oscillating element 202 are electrically connected via wiring conductors and viahole conductors formed in the main body 201 in similarly to that in FIG. 2, and are respectively made connectable to external circuits by external terminal electrodes 211 to 214 (only external terminal electrodes 211, 213 are shown in FIG. 25) formed, for example, at four corners of the bottom surface of the insulating layer 201d.

In this crystal oscillator 200, the crystal oscillating element 202 is mounted on the top surface of the main body 201 and covered by the cover 206, and the resin 207 is filled into the cavity 210 after the IC chip 203 and the electronic devices 204, 205 are mounted in the cavity 210 in the lower portion of the main body 201. The resin 207 is comprised of a first resin 207a for forming a first resin layer at the ceiling side of the cavity 210 and a second resin 207b for forming a second resin layer above the first resin layer. The first resin 207a is an epoxy hard resin having a viscosity of 3000 cps and a coefficient of shrinkage of 1.7% when being filled, and is adapted to strengthen the bonding between the IC chip 203 and the main body 201. Accordingly, an amount of the epoxy hard resin to be filled is such as to fill a clearance between the IC chip 203 and the ceiling surface of the cavity 210 and to cover the side surfaces of the IC chip 203. Since the first resin 207a has such a low viscosity, it easily fills out the above clearance, but is likely to wet the wall surfaces of the cavity 210. However, since the step 220 is present, the first resin 207a wets the wall surfaces from the ceiling surface of the cavity 210 to the step 220.

On the other hand, the second resin 207b is an epoxy hard resin having a viscosity of 4000 cps and a coefficient of shrinkage of 1.0% when being filled, and is adapted to prevent the entrance of humidity and dust from outside. Accordingly, an amount of the second resin 207b to be filled is such as to form the second resin layer having an average thickness of 0.1 mm or smaller. The thickness of the insulating layer 201d is set in relation to that of the second resin layer 207b. The second resin 207b filled on the first resin 207a has a high viscosity, and is unlikely to wet the inner side wall surfaces of the cavity 210. Besides that, since there is not the first resin 207a in the step 220 and the opening of the insulating layer 201c, the second resin 207b will not come out of the cavity 210. Accordingly, there is no likelihood that the entire height of the crystal oscillator 200 is deviated from the specifications and the external terminal electrodes 211 to 214 are covered to become insulating. Therefore, a yield of the crystal oscillator can be improved by a simple construction, and the crystal oscillator can be stably mounted on the printed circuit board.

In this crystal oscillator, the two kinds of resin are filled in the cavity 210, and the step 220 is formed on the inner walls of the cavity 210. In the case that three or more kinds of resin are to be filled, two or more steps 220 or a step like portion may be formed on the inner walls of the cavity 210. In other words, when the number of resin layers formed by filling different kinds of resin is m (where m≧2), (m−1) steps 220 are formed one after another on the inner walls of the cavity 210 along the thickness direction of the main body 201.

In the cavity of the crystal oscillator having no step formed on its inner walls, i.e., having flat wall surfaces, resin is likely to reach the opening edge of the cavity due to its wettability to the wall surfaces of the cavity and its surface tension when being filled. Accordingly, it has been required to accurately control the filling conditions of resin. However, the step 220 for defining the boundary between the first and second resin layers 207a and 207b is formed in this crystal oscillator. Thus, when the first resin 207a is filled into the cavity 210, the first resin 207a stops creeping up. at the first edge of the step 220. Further, when the resin 207b for the outermost layer is filled, the resin 207b stops creeping up at the opening edge of the cavity 210. In other words, the resin 207 can more easily filled compared to the cavity having no step. Also, the step 220 can specify the boundary with the molded resin on the outside surface.

The height or thickness of the step 220 is preferably 0.1 mm or greater. If the height is below 0.1 mm, the action of the step is poor in consideration of the amount of the resin to be filled.

In the foregoing embodiments, the lower-positioned cavity 10, 210 has an open bottom. Instead, a lower-positioned cavity having an open top may be formed as shown in FIGS. 26A to 26D.

Figure 26A:
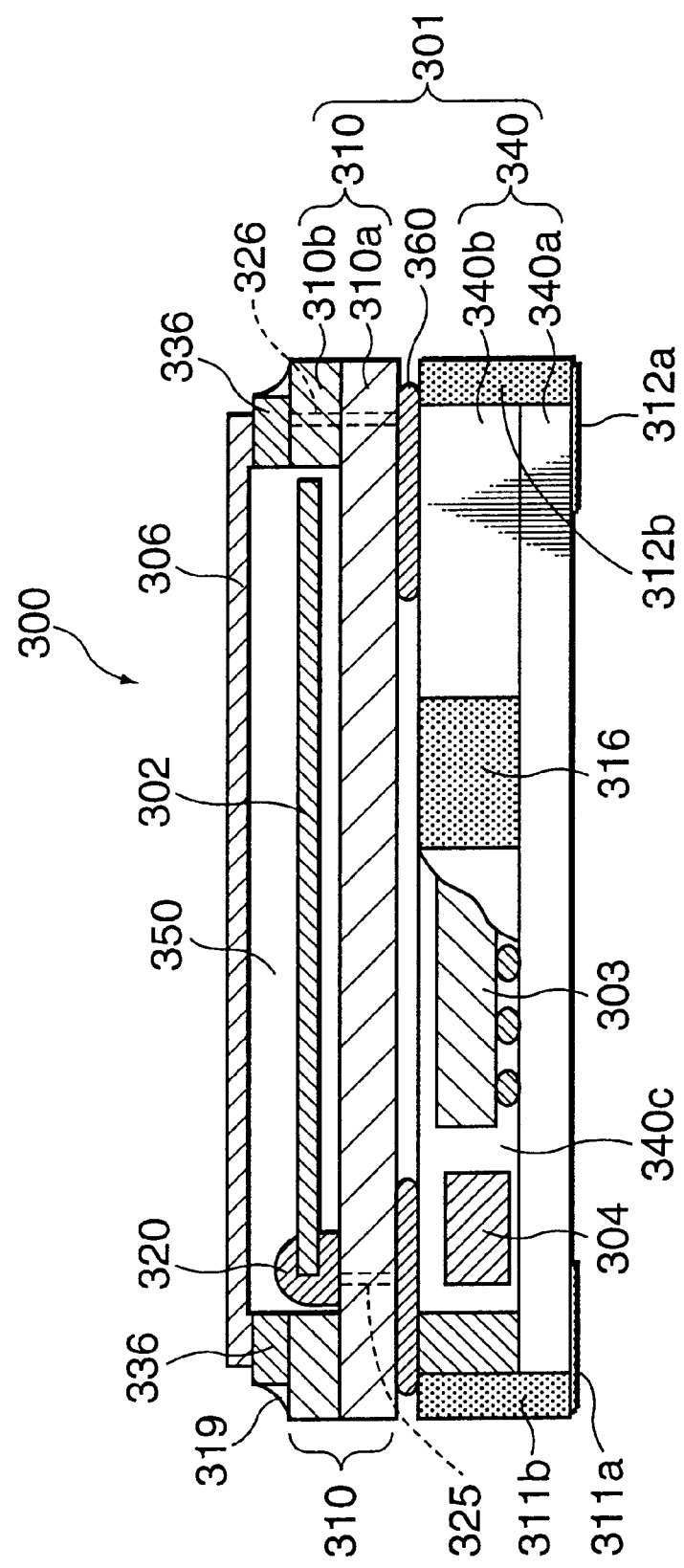
Figure 26B:
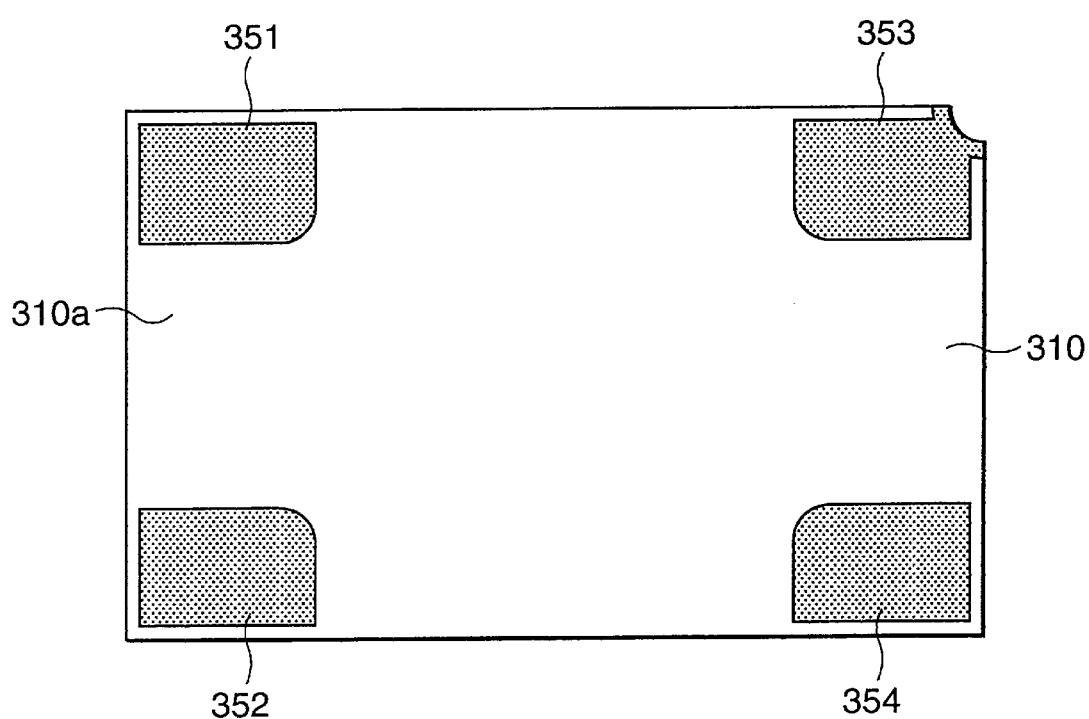
Figure 26C:
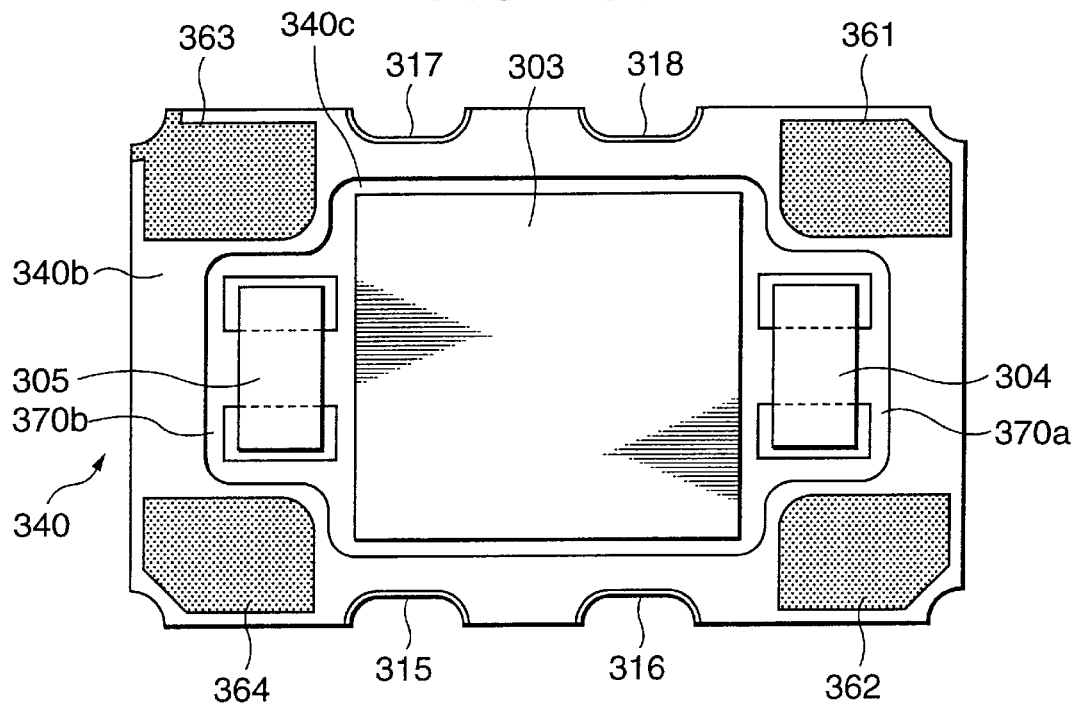
Figure 26D:
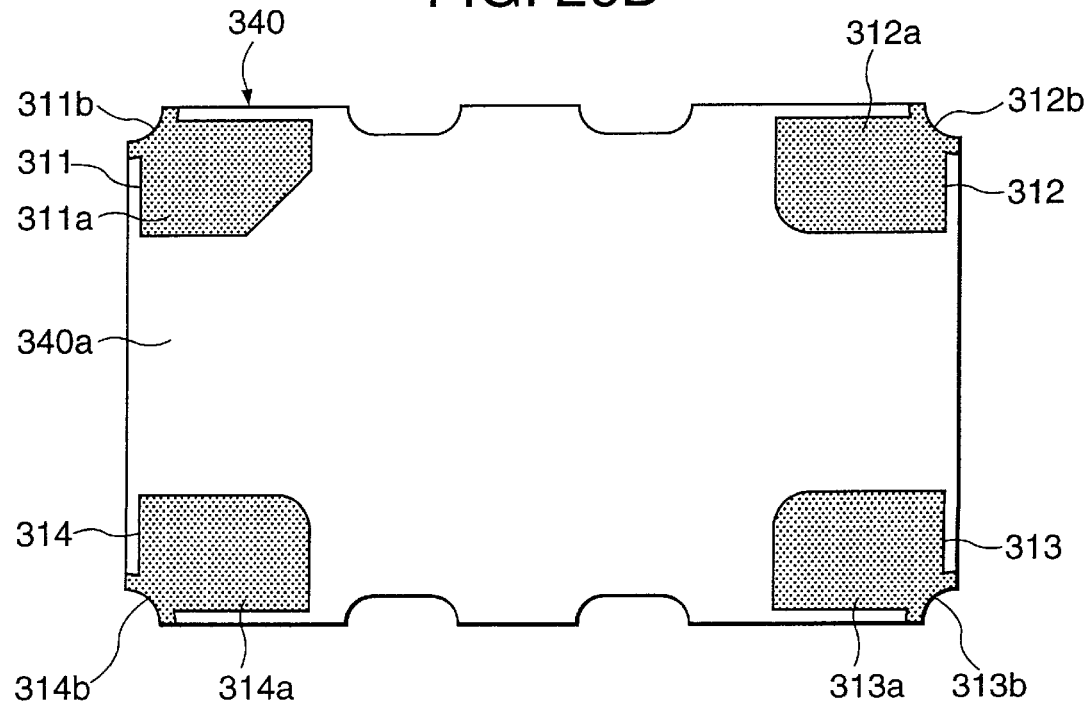
Figure 27:
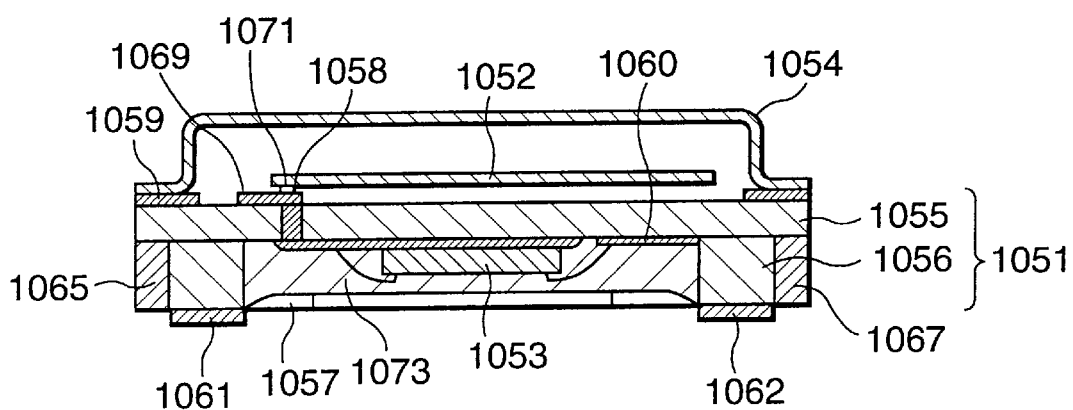
FIG. 27 is a sectional view of a conventional crystal oscillator.
Figure 28:
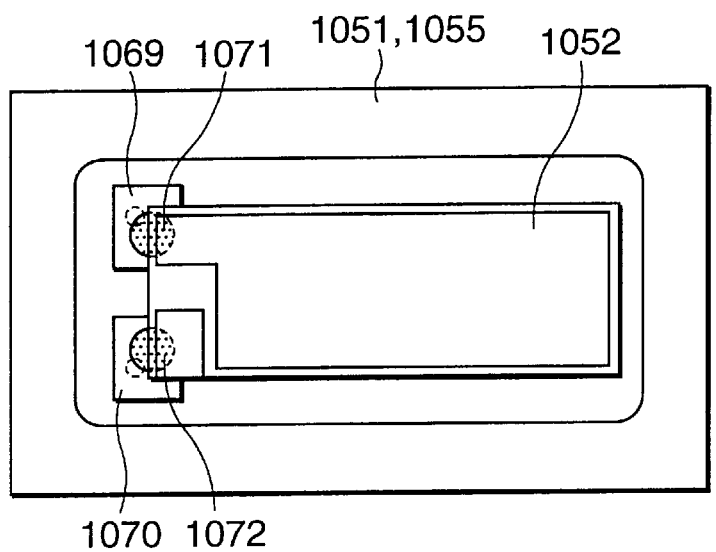
FIG. 28 is a sectional view of the conventional crystal oscillator, a cover being removed.
Figure 29:
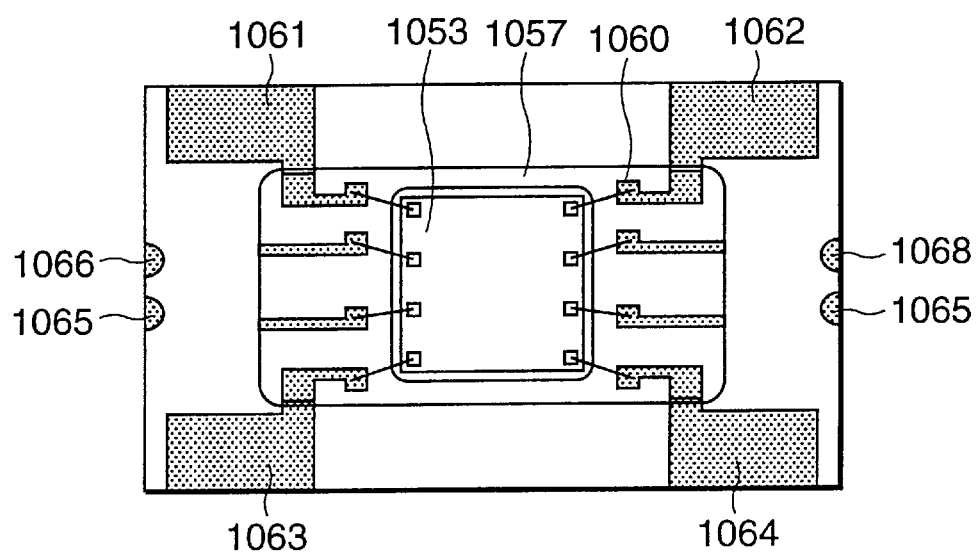
FIG. 29 is a bottom view of the conventional crystal oscillator, resin being removed.
Figure 30:
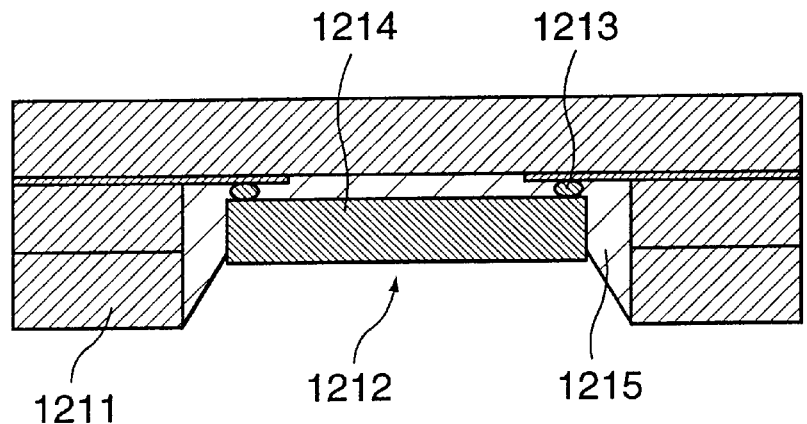
FIG. 30, corresponding to FIG. 21, is a sectional view of another conventional crystal oscillator to show a resin filling construction.
Figure 31:
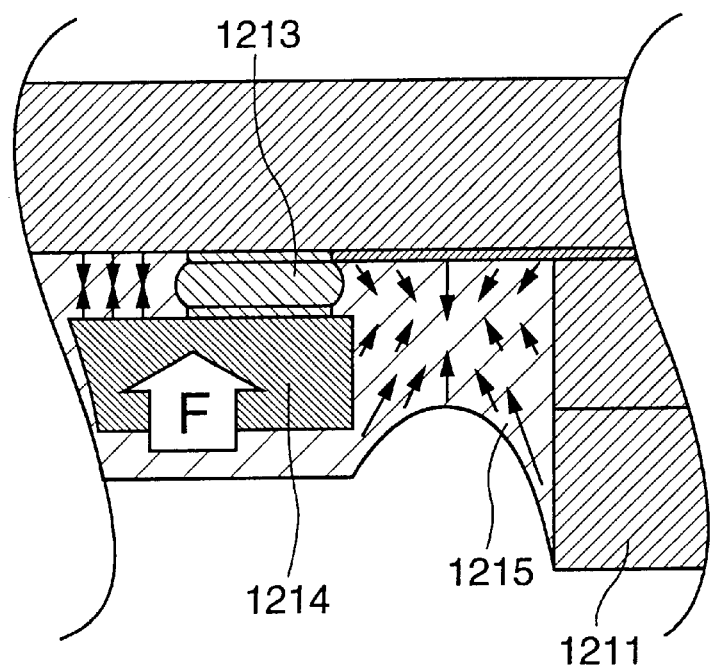
FIG. 31, corresponding to FIG. 22, is a partial enlarged sectional view of the conventional crystal oscillator of FIG. 30, representing stresses acting on an IC chip.

FIG. 26A is a side view in section partly cut away showing another crystal oscillator embodying the invention, FIG. 26B is a bottom view of an upper unit, FIG. 26C is a top view of a lower unit, and FIG. 26D is a bottom view of the lower unit. A main body 301 of a crystal oscillator 300 is formed by joining an upper unit 310 and a lower unit 340 which are separately formed. The upper unit 310 has two ceramic insulating layers 310a, 310b stacked one on top of another. A first cavity 350 is defined by a seam member 336 formed on the periphery of the ceramic insulating layer 310b and a metal cover 306 for covering the seam member 336. In the first cavity 350, a crystal oscillating element 302 is coupled via oscillating element electrode pads 320, 321 (not shown), and accommodated. Such a construction is substantially the same as the one shown in FIG. 2.

The insulating layers 310a, 310b are formed with viahole conductors 325, 326 for electrically connecting the oscillating element electrode pads 320, 321 and the seam member 336 with connection electrodes 351 to 354 provided on the bottom surface of the upper unit 310. The connection electrodes 351 to 354 are adapted to electrically connect the upper unit 310 with the lower unit 340. More specifically, the connection electrodes 351, 352 are electrically connected with the crystal oscillating element electrode pads 320, 321 through the viahole conductors 325, which serve as the monitor electrodes of the crystal oscillator of FIG. 2. The connection electrodes 353, 354 are electrically connected with the seam member 336 through the viahole conductors 326, which serve as GND electrodes. The metal cover 306 is at ground potential.

In the case where the insulating layer 310a is made up of two or more insulating sub-layers, internal wiring conductors may be formed between the insulating sub-layers to form conductive paths for connecting the oscillating element electrode pads 320, 321 and the seam member 336 with the connection electrodes 351 to 354.

The lower unit 340 is constructed by a plate-like ceramic insulating layer 340a and a ceramic insulating layer 340b having a space. The space of the insulating layer 340b and the plate-like insulating layer 340a define a lower cavity 340c. In the lower cavity 340c are mounted an IC chip 303 and two electronic devices 304, 305, such as capacitors, for controlling the operation and temperature compensation of the crystal oscillating element 302.

On the top surface of the insulating layer 340a is formed various wiring conductors for connection of the IC chip 303 and the electronic devices 304, 305. Also, the lower unit 340 is formed with connection electrodes 361 to 364 around the cavity 340c on the top surface thereof. The connection electrodes 361 to 364 of the lower unit 340 correspond to the connection electrodes 351 to 354 of the upper unit 310, respectively.

The connection electrodes 361, 362 are connected with IC electrode pads to input the oscillation signal of the crystal oscillating element 302 in the IC chip 303. The connection electrodes 363, 364 are connected with various wiring conductors at ground potential.

As shown FIG. 26D, the lower unit 340 is formed with four external terminal electrodes 311 to 314. Specifically, horizontal portions 311a to 314a of the four external terminal electrodes 311 to 314 are formed at four corners of the bottom surface of the lower unit 340. Vertical portions 311b to 314b of the four external terminal electrodes 311 to 314 are formed on vertical walls of quarter-sector recesses in four corners of the lower unit 340. The external terminal electrodes 311 to 314 are electrically connected with the wiring conductors on the bottom surface of the cavity 340c.

Further, the insulating layer 340b of the lower unit 340 is formed with four recesses in the opposite longer sides thereof. IC control terminal electrodes 315 to 318 are formed on inner walls of the recesses.

The upper unit 310 and the lower unit 340 are electrically connected with each other by conductive connectors 360 including welder or conductive resin paste, so that the connection electrodes 351 to 354 of the upper unit 310 are electrically connected with the connection electrodes 361 to 364 of the lower unit 340, respectively. Consequently, the top-opened cavity 340c of the lower unit 340 is sealed by the upper unit 310.

The inner side walls of the hollow insulating layer 340b may form a rectangular form. However, in this embodiment, the crystal oscillator 300 is miniaturized by forming a cross-shaped cavity 340c and mounting the IC chip 303 in the middle and the electronic devices 304, 305 on the right bulging space portion 370a and the left bulging space portion 370b.

As this invention may be embodied in several forms without departing from the spirit of essential characteristics thereof, the present embodiment is therefore illustrative an not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A surface-mount type crystal oscillator, comprising:
   a main body formed with a cavity in a lower portion thereof, the cavity being partitioned from a top surface of the main body by a partition wall and surrounded by cavity walls;
   a crystal oscillating element mounted on the top surface;
   a plurality of terminal electrodes on the main body disposed around the cavity walls and spaced from each other by separating areas of the cavity walls;
   extensions of the cavity protruding into the separating areas so that the terminal electrodes are separated by the extensions of the cavity; and
   a controlling IC chip and an electronic device accommodated in the lower cavity with the electronic device accommodated within the extensions of the cavity.

2. A surface-mount type crystal oscillator according to claim 1, wherein the main body is generally rectangular in a plan view, four terminal electrodes are respectively provided at four corners of the main body, and the cavity has four bulging space portions bulging into the four separating areas defined by the terminal electrodes.

3. A surface-mount type crystal oscillator according to claim 2, wherein the electronic device is a chip-shaped capacitor.

4. A surface-mount type crystal oscillator according to claim 2, wherein the cavity is defined by a laterally extending surface and side surfaces, and a pair of electronic device mount electrodes are formed on the laterally extending surface.

5. A surface-mount type crystal oscillator according to claim 4, wherein the pair of electronic device mount electrodes is each formed with a notch at its outer side.

6. A surface-mount type crystal oscillator according to claim 1, wherein the main body is generally rectangular in a plan view, four terminal electrodes are respectively provided at four corners of the main body, and the cavity has three bulging space portions bulging into three of the four separating areas defined by the terminal electrodes.

7. A surface-mount type crystal oscillator according to claim 6, wherein the electronic device is a chip-shaped capacitor.

8. A surface-mount type crystal oscillator according to claim 6, wherein the cavity is defined by a laterally extending surface and side surfaces, and a pair of electronic device mount electrodes are formed on the laterally extending surface.

9. A surface-mount type crystal oscillator according to claim 8, wherein the pair of electronic device mount electrodes is each formed with a notch at its outer side.

10. A surface-mount type crystal oscillator according to claim 1, wherein the main body includes:
an upper unit having a top surface and a bottom surface, the top surface defining the top surface of the main body;
a lower unit formed with the cavity, the cavity being top opened, and the opening of the cavity being closed by the bottom surface of the upper unit.

11. A surface-mount type crystal oscillator according to claim 10, wherein:
the lower unit is provided with a plurality of lower connection electrodes on a top surface around the opening of the cavity, and provided with the terminal electrodes, the terminal electrodes being electrically connected with the IC chip and the electronic device;
the upper unit is provided with a plurality of upper connection electrodes on the bottom surface thereof at positions corresponding to the plurality of lower connection electrodes, respectively, at least two of the plurality of upper connection electrodes being electrically connected with the crystal oscillating element on the top surface thereof.

12. A surface-mount type crystal oscillator according to claim 11, wherein the upper unit is formed by a plurality of insulating layers, and further provided with a viahole conductor extending in a thickness direction of the upper unit and an internal wiring conductor between the insulating layers for connecting the crystal oscillating element with the at least two upper connection electrodes.

13. A surface-mount type crystal oscillator comprising:
a main body formed with a cavity in a lower portion thereof, the cavity being partitioned from a top surface of the main body by a partition wall and surrounded by cavity walls;
a crystal oscillating element mounted on the top surface;
a plurality of terminal electrodes on the main body disposed around the cavity walls and spaced from each other by separating areas of the cavity walls;
extensions of the cavity protruding into the separating areas so that the terminal electrodes are separated by the extensions of the cavity;
a controlling IC chip and an electronic device accommodated in the lower cavity; and
a thermosetting resin filling the cavity with a thickness of resin covering a lower surface of the IC chip being less than a thickness of resin between an inner surface of the IC chip and an inner laterally extending surface of the cavity, and a thickness of resin between a side surface of the IC chip and a side surface of the cavity being less than a thickness of the IC chip.

14. A surface-mount type crystal oscillator comprising:
a main body formed with a cavity in a lower portion thereof, the cavity being partitioned from a top surface of the main body by a partition wall and surrounded by cavity walls, each cavity wall having a step adjacent to the cavity;
a crystal oscillating element mounted on the top surface;
a plurality of terminal electrodes on the main body disposed around the cavity walls and spaced from each other by separating areas of the cavity walls;
extensions of the cavity protruding into the separating areas so that the terminal electrodes are separated by the extensions of the cavity;
a controlling IC chip and an electronic device accommodated in the lower cavity; and
a layer of thermosetting resin disposed within the cavity with the step serving to retain the resin within the cavity.

15. A surface-mount type crystal oscillator comprising:
a main body formed with a cavity in a lower portion thereof, the cavity being partitioned from a top surface of the main body by a partition wall and surrounded by cavity walls;
a crystal oscillating element mounted on the top surface;
a plurality of terminal electrodes on the main body disposed around the cavity walls and spaced from each other by separating areas of the cavity walls;
extensions of the cavity protruding into the separating areas so that the terminal electrodes are separated by the extensions of the cavity;
a controlling IC chip and an electronic device accommodated in the lower cavity; and
resin filling the cavity, the resin comprising:
a first resin layer filling both a space between the cavity and a bottom surface of the IC chip and a space between the cavity and side surfaces of the IC chip; and
a second resin layer covering top surfaces of the IC chip and the first resin layer.

16. A surface-mount type crystal oscillator comprising:
a main body formed with a cavity in a lower portion thereof, the cavity being partitioned from a top surface of the main body by a partition wall and surrounded by cavity walls, each cavity wall having a step adjacent to the cavity;
a crystal oscillating element mounted on the top surface by a mount electrode pad with a groove formed in the top surface around the mount electrode pad;
a plurality of terminal electrodes on the main body disposed around the cavity walls and spaced from each other by separating areas of the cavity walls;
extensions of the cavity protruding into the separating areas so that the terminal electrodes are separated by the extensions of the cavity; and
a controlling IC chip and an electronic device accommodated in the lower cavity.

17. A surface-mount type crystal oscillator according to claim 16, wherein two mount electrode pads are arranged side by side, and the groove is formed in an area between the two mount electrode pads.

18. A surface-mount type crystal oscillator according to claim 16, wherein the groove is formed in an area between the mount electrode pad and a free end of the crystal oscillating element.

* * * * *